(12) United States Patent
Kanaya et al.

(10) Patent No.: US 9,171,886 B2
(45) Date of Patent: Oct. 27, 2015

(54) SEMICONDUCTOR MEMORY DEVICE AND MANUFACTURING METHOD THEREOF

(75) Inventors: Hiroyuki Kanaya, Yokohama (JP);
Yukinori Koyama, Yokohama (JP);
Susumu Shuto, Yokohama (JP);
Kuniaki Sugiura, Fujisawa (JP)

(73) Assignee: KABUSHIKI KAISHA TOSHIBA, Tokyo (JP)

(*) Notice: Subject to any disclaimer, the term of this patent is extended or adjusted under 35 U.S.C. 154(b) by 324 days.

(21) Appl. No.: 13/032,359

(22) Filed: Feb. 22, 2011

(65) Prior Publication Data
US 2011/0266600 A1  Nov. 3, 2011

(30) Foreign Application Priority Data

Apr. 30, 2010 (JP) ................. 2010-105450

(51) Int. Cl.
*H01L 29/82* (2006.01)
*H01L 27/22* (2006.01)
*H01L 21/768* (2006.01)
*H01L 43/12* (2006.01)

(52) U.S. Cl.
CPC ........ *H01L 27/228* (2013.01); *H01L 21/76897* (2013.01); *H01L 43/12* (2013.01)

(58) Field of Classification Search
CPC ... H01L 27/228; H01L 27/24; H01L 27/2436; H01L 27/2463; H01L 45/06; H01L 27/10852; H01L 28/40; H01L 28/55; H01L 28/60; H01L 28/65; H01L 28/90; H01L 45/085; H01L 45/1233; H01L 45/143; H01L 45/1683; H01L 21/4853; H01L 21/486; H01L 2224/16; H01L 2924/01019; H01L 2924/01025; H01L 2924/01057; H01L 2924/01078; H01L 2924/01079; H01L 2924/09701; H01L 2924/15311; H01L 2924/3011

USPC .......... 257/421, 427, E39.323, E21.495, 2, 3, 257/4, E45, E27.104, 295, E29.343, 532, 257/E21.008, E21.011, E21.014, E45.002, 257/306; 438/3; 365/128
See application file for complete search history.

(56) References Cited

U.S. PATENT DOCUMENTS 6,132,853 A * 10/2000 Noddin ................. 428/209
6,916,669 B2 * 7/2005 Jones et al. ................ 438/3
(Continued)

FOREIGN PATENT DOCUMENTS

JP 2008-098365 * 11/2006
JP 2008-98365    4/2008

OTHER PUBLICATIONS

U.S. Appl. No. 12/854,724, filed Aug. 11, 2010, Sugiura.

*Primary Examiner* — Stephen W Smoot
*Assistant Examiner* — Edward Chin
(74) *Attorney, Agent, or Firm* — Knobbe, Martens, Olsen & Bear LLP

(57) ABSTRACT

A semiconductor memory device according to embodiments includes a semiconductor substrate and plural switching transistors provided on the semiconductor substrate. In the semiconductor memory device, a contact plug is embedded between adjacent two of the switching transistors, and is insulated from gates of the adjacent two switching transistors. The contact plug is also electrically connected to a source or a drain of each of the adjacent two switching transistors, and an upper surface of the contact plug is at a position higher than an upper surface of the switching transistors. A memory element is provided on the upper surface of the contact plug and stores data. A wiring is provided on the memory element.

2 Claims, 20 Drawing Sheets

(56) References Cited

U.S. PATENT DOCUMENTS

| | | | |
|---|---|---|---|
| 6,930,369 B2* | 8/2005 | Nickel et al. | 257/421 |
| 7,148,531 B2* | 12/2006 | Daughton et al. | 257/295 |
| 7,205,590 B2* | 4/2007 | Fukuzumi | 257/211 |
| 7,508,041 B2* | 3/2009 | Noh et al. | 257/422 |
| 7,821,086 B2* | 10/2010 | Kajiyama | 257/421 |
| 7,956,343 B2* | 6/2011 | Kwon et al. | 257/2 |
| 8,298,875 B1* | 10/2012 | Or-Bach et al. | 438/141 |
| 2003/0082896 A1* | 5/2003 | Cheng | 438/612 |
| 2004/0087163 A1* | 5/2004 | Steimle et al. | 438/694 |
| 2004/0180530 A1* | 9/2004 | Li et al. | 438/622 |
| 2006/0038247 A1* | 2/2006 | Noh et al. | 257/421 |
| 2007/0045702 A1* | 3/2007 | Liang | 257/306 |
| 2007/0091674 A1* | 4/2007 | Park et al. | 365/171 |
| 2007/0181932 A1* | 8/2007 | Happ et al. | 257/314 |
| 2007/0246787 A1* | 10/2007 | Wang et al. | 257/421 |
| 2008/0076191 A1* | 3/2008 | Hall et al. | 438/3 |
| 2008/0081462 A1* | 4/2008 | Choi | 438/637 |
| 2008/0164502 A1* | 7/2008 | Fukumoto et al. | 257/295 |
| 2008/0185670 A1* | 8/2008 | Kajiyama | 257/421 |
| 2008/0277762 A1* | 11/2008 | Takewaki et al. | 257/532 |
| 2009/0008743 A1* | 1/2009 | Lee et al. | 257/532 |
| 2009/0134493 A1* | 5/2009 | Iwaki | 257/532 |
| 2009/0200638 A1* | 8/2009 | Smith | 257/532 |
| 2009/0250735 A1* | 10/2009 | Asao | 257/295 |
| 2009/0256220 A1* | 10/2009 | Horng et al. | 257/421 |
| 2009/0302301 A1* | 12/2009 | Hwang | 257/4 |
| 2010/0002492 A1* | 1/2010 | Kajiyama | 365/148 |
| 2010/0181649 A1* | 7/2010 | Lung et al. | 257/588 |
| 2010/0188890 A1* | 7/2010 | Fukami et al. | 365/158 |
| 2011/0037108 A1* | 2/2011 | Sugiura et al. | 257/295 |
| 2011/0044096 A1* | 2/2011 | Li | 365/158 |
| 2011/0129691 A1* | 6/2011 | Ishiwata et al. | 428/828 |
| 2011/0207265 A1* | 8/2011 | Kwon et al. | 438/122 |
| 2011/0254112 A1* | 10/2011 | Yamanaka et al. | 257/421 |
| 2011/0266600 A1* | 11/2011 | Kanaya et al. | 257/295 |
| 2011/0273928 A1* | 11/2011 | Ong et al. | 365/171 |
| 2011/0305074 A1* | 12/2011 | Lung et al. | 365/163 |
| 2012/0142161 A1* | 6/2012 | Ha et al. | 438/381 |
| 2012/0145985 A1* | 6/2012 | Lee | 257/4 |
| 2012/0193693 A1* | 8/2012 | Kanaya | 257/295 |
| 2012/0211811 A1* | 8/2012 | Nagahara et al. | 257/295 |
| 2013/0277680 A1* | 10/2013 | Green et al. | 257/76 |
| 2015/0048483 A1* | 2/2015 | Kuo et al. | 257/532 |

\* cited by examiner

SEMICONDUCTOR MEMORY DEVICE AND MANUFACTURING METHOD THEREOF

CROSS REFERENCE TO RELATED APPLICATIONS

This application is based upon and claims the benefit of priority from the prior Japanese Patent Application No. 2010-105450, filed on Apr. 30, 2010, the entire contents of which are incorporated herein by reference.

FIELD

The embodiments of the present invention relate to a semiconductor memory device and manufacturing method thereof.

BACKGROUND

Semiconductor memories such as MRAM (magnetic random access memory) using a resistance change element as a memory element have been developed recently. An MRAM is a memory storing data "1" or data "0" in memory cells by using magnetoresistive effects, and has nonvolatility, high-speed operation, high integration, and high reliability. Therefore, the MRAM is a potential candidate for a memory device substituting an SRAM, a PSRAM (Pseudo SRAM), a DRAM and the like.

There have been many reports of an MRAM using an element demonstrating a TMR (tunneling magnetoresistive) effect among the magnetoresistive effects. An MTJ (magnetic tunnel junction) element using the TMR effect has a laminate structure including two ferromagnetic layers and a nonmagnetic layer (an insulating thin film) sandwiched between these ferromagnetic layers, and stores digital data based on a change of a magnetoresistance due to a spin-polarized tunneling effect. The MTJ element can take a low resistance state and a high resistance state by a magnetization arrangement of the two ferromagnetic layers. One-bit data can be recorded in the MTJ element, by defining a low resistance state as data "0" and defining a high resistance state as data "1".

In recent years, downscaling of MRAMs has been progressed to increase the data memory capacity, to reduce power consumption, and to reduce the manufacturing cost. As one of means for downscaling the MRAM, there is a configuration of arranging an MTJ element on a contact plug between adjacent two switching transistors. In this case, the roughness of an upper surface of the contact plug affects an electric property and a magnetic property.

Generally, an aspect ratio of a trench between switching transistors is formed large to downscale an element and to reduce resistances of word lines. Therefore, both or either one of a void and a seam occurs in a contact plug when a conductive material (tungsten, for example) as a material of the contact plug is embedded between adjacent switching transistors. Both or either one of the void and the seam becomes a cause of a dip on the upper surface of the contact plug, and causes a negative influence on the flatness of the upper surface of the contact plug.

When the flatness of the upper surface of the contact plug is poor, an uneven shape of the upper surface of the contact plug is transferred to the MTJ element on the contact plug. That is, the flatness of the insulating thin film sandwiched between the two ferromagnetic layers of the MTJ element also becomes poor. In this case, when a voltage is applied to the MTJ element, electric fields are locally concentrated in the insulating thin film, and this has a possibility of destructing the insulating thin film. Consequently, the roughness of the upper surface of the contact plug causes a negative influence on the electric property and the magnetic property of the MTJ element, and affects the reliability of the MRAM.

When there is a large dip on the upper surface of the contact plug, the MTJ element on the contact plug is inclined to a substrate surface in some cases due to misalignment of lithography or the like. When the MTJ element is inclined, a protection film or the like covering the MTJ element gives a bias stress to the MTJ element, and this has a possibility of degrading the electric property or the magnetic property of the MTJ element. Consequently, the inclination of the MTJ element also causes a negative influence on the reliability of the MRAM.

DETAILED DESCRIPTION

A semiconductor memory device according to embodiments of the present invention includes a semiconductor substrate and plural switching transistors provided on the semiconductor substrate. In the semiconductor memory device, a contact plug is embedded between adjacent two of the switching transistors, and is insulated from gates of the adjacent two switching transistors. The contact plug is also electrically connected to a source or a drain of each of the adjacent two switching transistors, and an upper surface of the contact plug is at a position higher than an upper surface of the switching transistors. A memory element is provided on the upper surface of the contact plug and stores data. A wiring is provided on the memory element.

Embodiments will now be explained with reference to the accompanying drawings. The present invention is not limited to the embodiments.

The following embodiments can be used for various kinds of memories such as an MRAM, a ReRAM (resistance random access memory), a PRAM (phase-change random access memory), and an FeRAM (ferroelectric random access memory). In the following embodiments, an MRAM is explained as an example of a resistance change memory. The MRAM includes as a memory element an MTJ element using the TMR effect, and stores information based on a magnetization state of the MTJ element. Data can be rewritten by a spin injection system. The spin injection system is a system of directly rewriting magnetization of the MTJ element by passing to the MTJ element electrons of which magnetization directions are polarized to one side.

First Embodiment

Figure 1:
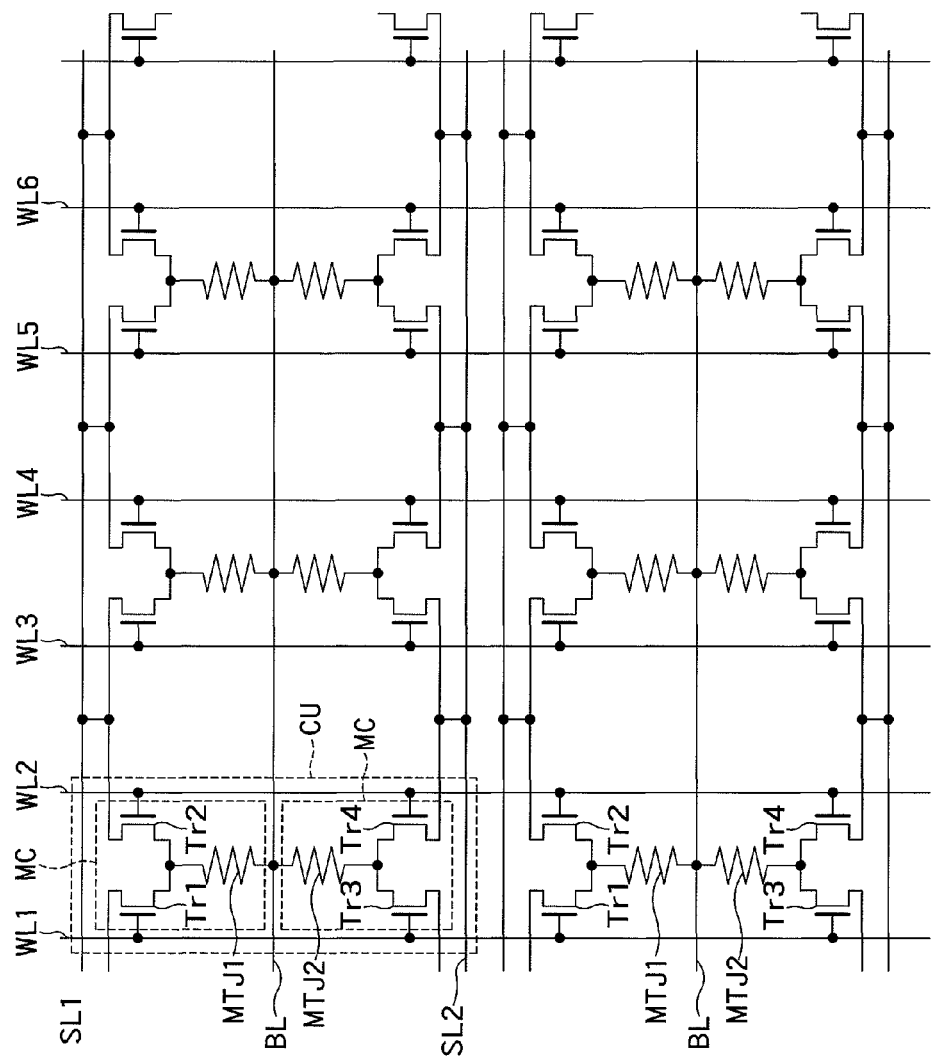
FIG. 1 is an equivalent circuit diagram showing an example of a configuration of a memory cell array of an MRAM according to a first embodiment.

FIG. 1 is an equivalent circuit diagram showing an example of a configuration of a memory cell array of an MRAM according to a first embodiment. The memory cell array is configured by two-dimensionally arranging plural MRAM cells (memory cells MC) in a matrix shape. Word lines WLi (i is an integer) are extended to a first direction. Bit lines BLi and source lines SLi are extended to a second direction orthogonal with the first direction.

Each of the MRAM cells includes an MTJ element and a switching transistor Tri. The MTJ element as a memory element is a resistance change element configured by having sequentially stacked a fixed layer, a tunnel barrier layer, and a recording layer. The fixed layer and the recording layer are configured by a ferromagnetic substance, and the tunnel barrier layer is formed by an insulating film. The fixed layer has a magnetization direction fixed. The recording layer has a magnetization direction variable, and stores data based on the magnetization direction.

The switching transistor Tri is provided to select an MTJ element in a data write operation or a data read operation. In FIG. 1, reference characters are attached to only a part of MTJ elements, switching transistors, word lines, bit lines, and source lines, respectively, for simplicity.

In FIG. 1, MTJ1 and MTJ2 denote MTJ elements, Tr1 to Tr4 denote switching transistors, WL1 to WL6 denote word lines, SL1 and SL2 denote source lines, and BL denotes a bit line.

In the first embodiment, one MRAM cell is configured by one MTJ element and two switching transistors. A gate of the switching transistor Tr1 is connected to the word line WL1. A gate of the switching transistor Tr2 is connected to the word line WL2 adjacent to the word line WL1. Sources of the switching transistors Tr1 and Tr2 are connected to the source line SL1. Drains of the switching transistors Tr1 and Tr2 share a diffusion layer (common drains). The drains of the switching transistors Tr1 and Tr2 are connected to a lower ferromagnetic layer (a fixed layer, for example) of the MTJ element MTJ1. An upper ferromagnetic layer (a recording layer, for example) of the MTJ element MTJ1 is connected to a bit line BL adjacent to the source line SL1 via a wiring.

The first MOS transistor Tr1, the second MOS transistor Tr2, and the MTJ element MTJ1 constitute one MRAM cell (one memory cell MC). Data is written into and read from the memory cell MC by controlling a voltage applied to a word line, a bit line, and a source line.

Similarly, sources of the switching transistors Tr3 and Tr4 are connected to the source line SL2. The source line SL2 is adjacent to the bit line BL at an opposite side of the source line SL1. Gates of the switching transistors Tr3 and Tr4 are connected to the word lines WL1 and WL2, respectively. Drains (common drains) of the switching transistors Tr3 and Tr4 are connected to a lower ferromagnetic layer of the MTJ element MTJ2. An upper ferromagnetic layer of the MTJ element MTJ2 is connected to the bit line BL via a wiring. The upper ferromagnetic layer of the MTJ element MTJ2 and the upper ferromagnetic layer of the MTJ element MTJ1 are connected in common to the bit line BL.

The switching transistors Tr1 to Tr4 and the MTJ elements MTJ1 and MTJ2 constitute two memory cells MC. A pair of memory cells MC sharing the bit line BL and a word line WL constitute one cell unit CU. Plural cell units CU are provided between the word lines WL1 and WL2, between the word lines WL3 and WL4, and between the word lines WL5 and WL6, respectively.

Figure 2:
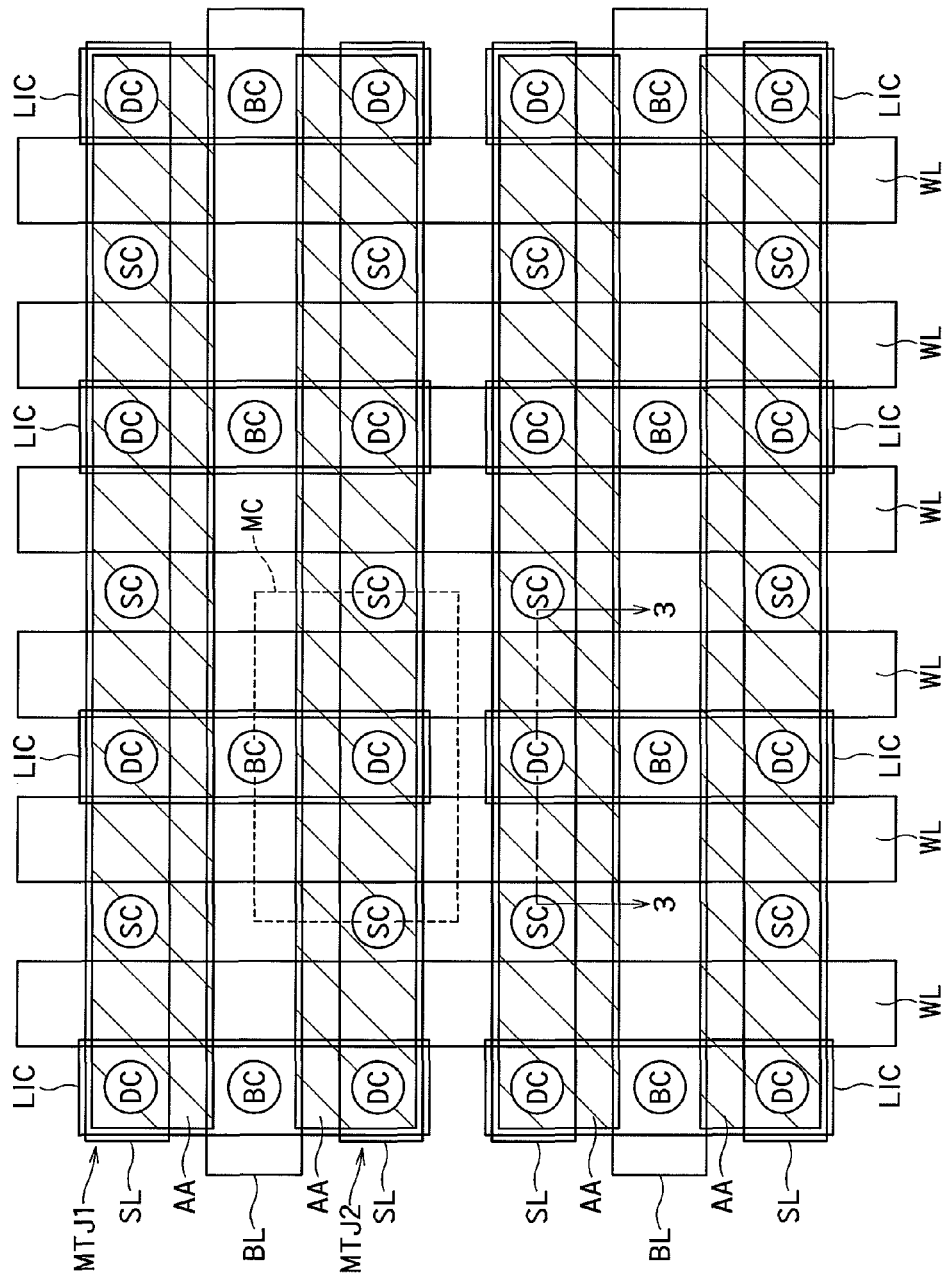
FIG. 2 is a plane layout diagram showing an example of a configuration of a memory cell array of an MRAM according to the first embodiment.

FIG. 2 is a plane layout diagram showing an example of a configuration of a memory cell array of an MRAM according to the first embodiment. A local interconnect LIC is connected to each upper ferromagnetic layer of two memory cells MC in one cell unit CU, and is also connected to the bit line BL via a bit line contact BC. Accordingly, the upper ferromagnetic layers of the two memory cells MC in each of the cell units CU are connected in common to the bit line BL.

The switching transistor Tri is formed in an active area AA extended to the second direction. The switching transistor Tri and a switching transistor Tr(i−1) or Tr(i+1) adjacent to the switching transistor Tri in the second direction share a drain contact DC or a source contact SC. Therefore, drain contacts DC and source contacts SC are alternately arranged in each active area AA as shown in FIG. 2.

The drain contacts DC are contact plugs formed immediately below the MTJ elements MTJ1 and MTJ2. The drain contacts DC are embedded between the switching transistors Tr1 and Tr2, and are connected in common to the drains of the switching transistors Tr1 and Tr2.

The source contacts SC are contact plugs embedded between the switching transistors Tr1 and Tr2, and are connected in common to the sources of the switching transistors Tr1 and Tr2.

An area of a dashed-line frame shows a unit area of one memory cell MC. A plane size of this unit area is $12F^2$ which is $3F \times 4F$ (F is a minimum feature size). A width of the active area AA in the first direction is 2F. A width of an STI (Shallow Trench Isolation) area sandwiched by adjacent two active areas AA is F. However, plane sizes of the memory cells MC and the like are not limited to these, and can be smaller sizes. Configurations of the memory cells MC and the cell units CU are not limited to configurations shown in FIG. 1 and FIG. 2. For example, an MTJ element and a switching transistor in the memory cell MC can be in configurations corresponding to one to one, when Ion of the switching transistor can be large.

Figure 3:
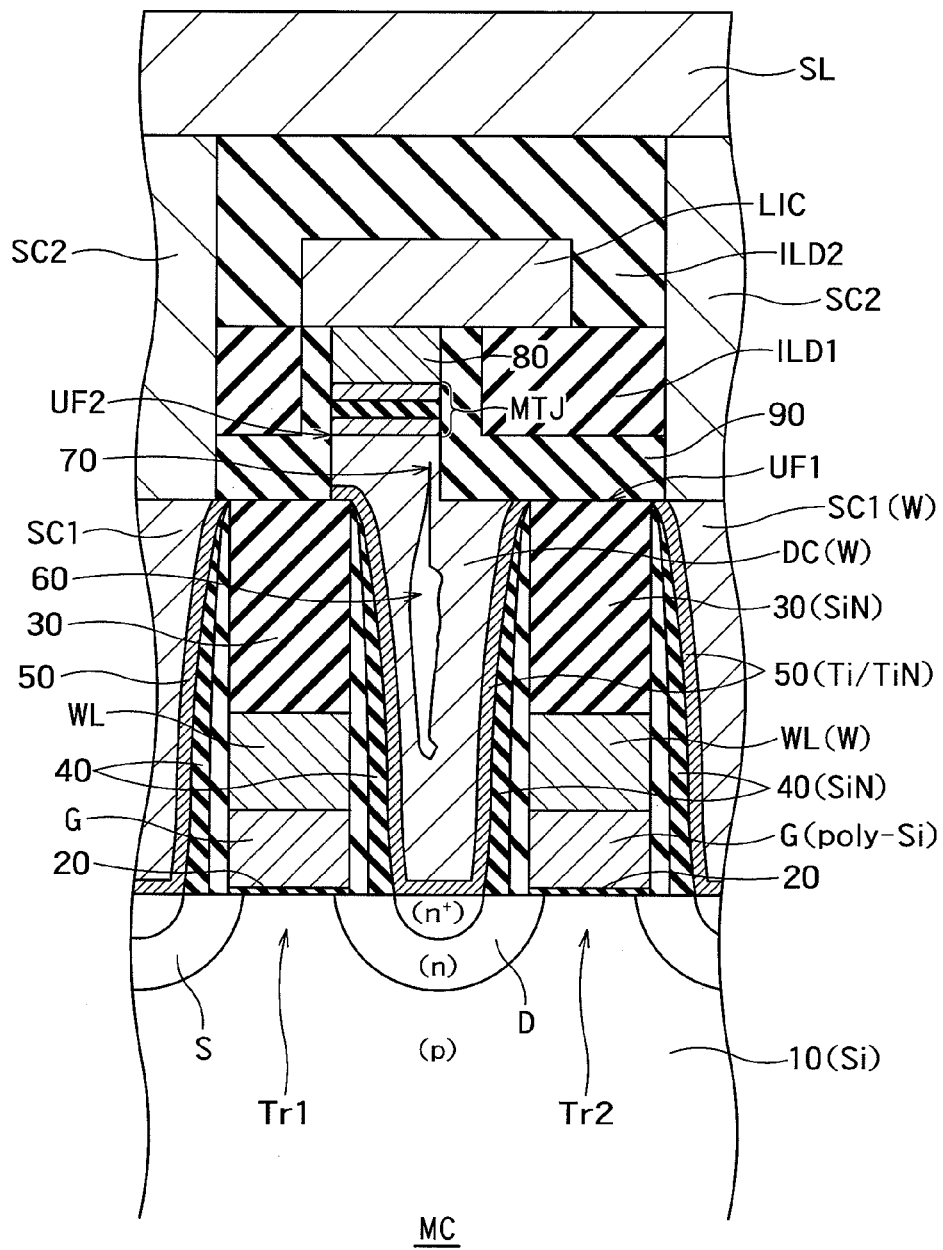
FIG. 3 is a cross-sectional view of the memory cell MC cut along a line 3-3 in FIG. 2.

FIG. 3 is a cross-sectional view of the memory cell MC cut along a line 3-3 in FIG. 2. Plural switching transistors Tr1 and Tr2 arranged in the second direction are provided on a semiconductor substrate 10.

Each of the switching transistors Tr1 and Tr2 includes a source layer S, a gate dielectric film 20, a gate G, a word line WL, and a protection film 30. A drain layer D is shared by the switching transistors Tr1 and Tr2. The switching transistors Tr1 and Tr2 are adjacent to each other in the second direction by sandwiching the drain layer D.

The semiconductor substrate 10 is a p-type silicon substrate, for example. The source layer S and the drain layer D are n-type diffusion layers, for example. The gate G is provided on the gate dielectric film 20, and is insulated from the semiconductor substrate 10 by the gate dielectric film 20. The gate G is made of a conductive material such as doped polysilicon, for example. The word line WL is provided on the gate G, and is made of a conductive material such as tungsten, for example. The word line WL is extended to the second direction orthogonal with the source line SL and the bit line BL (a direction perpendicular to the drawing of FIG. 3). The protection film 30 is provided on the word line WL, and is constituted by an insulation film such as a silicon nitride film, for example.

A sidewall film 40 is provided on side surfaces of the gate G, the word line WL, and the protection film 30, respectively. The sidewall film 40 is constituted by an insulation film such as a silicon nitride film.

A barrier film 50 is provided on the sidewall film 40, the source layer S, and the drain layer D, respectively. The barrier film 50 is made of a conductive material such as a laminated film of titanium and titanium nitride, for example. The barrier film 50 avoids a direct contact between a metal material (tungsten, for example) of the drain contact DC and a source contact SC1 and the semiconductor substrate 10. With this arrangement, a diffusion of the metal material of the drain contact DC to the semiconductor substrate 10 can be suppressed, and the semiconductor substrate 10 can be protected.

The drain contact DC as a contact plug is embedded between the switching transistors Tr1 and Tr2, and is electrically connected to the drain layer D via the barrier film 50. The drain contact DC is electrically isolated from each word line WL and each gate G of the switching transistors Tr1 and Tr2 by the protection film 30 and the sidewall film 40. That is, the drain contact DC is electrically connected to the drain layer D while maintaining a state of insulation from the word line WL and the gate G.

The source contact SC1 as a contact plug is embedded between adjacent switching transistors, and is electrically connected to the source layer S via the barrier film 50. The source contact SC1 is also electrically isolated from each word line WL and each gate G of the switching transistors Tr1 and Tr2 by the protection film 30 and the sidewall film 40. That is, the source contact SC1 is electrically connected to the source layer S while maintaining a state of insulation from the word line WL and the gate G.

An upper surface UF2 of the drain contact DC is at a position higher than an upper surface (an upper surface of the protection film 30) UF1 of the switching transistors Tr1 and Tr2. This arrangement is provided to prevent the void 60 and the seam 70 in the drain contact DC from causing a negative influence to the roughness of the upper surface UF2 of the drain contact DC. That is, in the first embodiment, the drain contact DC is formed at a position higher than the upper surface UF1 of the switching transistors Tr1 and Tr2 to have satisfactory flatness of the upper surface UF2 of the drain contact DC. An upper surface of the source contact SC1 is at the same height as the upper surface UF1 of the switching transistors Tr1 and Tr2.

The MTJ element is formed on the upper surface UF2 of the drain contact DC. The MTJ element is laminated in the order of a fixed layer, a tunnel barrier film, and a recording layer. The tunnel barrier film is constituted by an insulating thin film such as magnesium oxide, for example. A magnetization direction of the fixed layer is fixed. Accordingly, the MTJ element stores data in the magnetization direction of the recording layer.

A conductive electrode 80 also functioning as a hardmask is provided on the MTJ element. The electrode 80 is a single-layer film or a laminated film of Ta, TiAlxNy, TaN, TiN, WN, and W.

A protection film 90 is provided on side surfaces of upper parts of the electrode 80, the MTJ element, and the drain contact DC, respectively, and on the upper surface UF1 of the switching transistors Tr1 and Tr2. The protection film 90 is constituted by a silicon nitride film, for example.

An interlayer dielectric film ILD1 is provided on the protection film 90.

A local interconnect LIC is provided on the electrode 80, the protection film 90, and the interlayer dielectric film ILD1, respectively. The local interconnect LIC is extended to the first direction, and is electrically connected to a recording layer of the MTJ element adjacent in the first direction.

An interlayer dielectric film ILD2 is provided on the local interconnect LIC, and a source wiring SL is provided on the interlayer dielectric film ILD2. The source wiring SL is electrically connected to the source layer S of the switching transistors Tr1 and Tr2 via the source contacts SC1 and SC2.

According to the first embodiment, the upper surface UF2 of the drain contact DC is at a position higher than the upper surface UF1 of the switching transistors Tr1 and Tr2. A conventional drain contact is provided by embedding a contact material between adjacent switching transistors, and thereafter by polishing the contact material by using CMP (Chemical Mechanical Polishing) until when an upper surface of the switching transistors (an upper surface of the protection film 30) is exposed. Therefore, the upper surface of the drain contact is at substantially the same height as that of an upper surface of a switching transistor. However, in this case, the flatness of the upper surface of the drain contact is poor due to the void 60, and this causes a negative influence on the reliability of the MTJ element, as described above.

In the first embodiment, the drain contact DC is left at a position higher than the upper surface UF1 of the switching transistors Tr1 and Tr2. With this arrangement, a negative influence caused by the void 60 to the upper surface UF2 of the drain contact DC can be suppressed. As a result, the roughness of the upper surface UF2 can be set satisfactory, and the reliability of the memory can be improved.

The roughness of the upper surface UF2 is a value obtained by averaging absolute values of heights (depths) of unevenness from an average surface which is a standard of having unevenness of the upper surface UF2 flattened. That is, the average surface of the upper surface UF2 is the upper surface flattened the unevenness thereof. For example, a height (a depth) of unevenness from the average surface is measured at a predetermined distance, and measured heights (depths) are averaged. In this case, heights of convex portions and depths of concave portions are averaged in absolute values. Based on this, the roughness shows the degree of unevenness from the average surface.

In the first embodiment, the roughness of the upper surface UF2 is preferably equal to or smaller than 0.2 nm when a thickness of an MTJ element is about 50 nm and also when the size of the upper surface UF2 is about $50 \times 50 \, nm^2$. In this case, a magnetic property and an electric property of the MTJ element have small degradation.

FIG. 3 shows a state that an upper part of the drain contact DC is deviated to a left side. Conventionally, when a position of an MTJ element is deviated from a center of the drain contact DC, there is a high possibility that the MTJ element is inclined due to the void 60 or the seam 70. When the MTJ element is inclined, a bias stress is applied to the MTJ element as described above, and this causes a negative influence on the reliability of the memory.

However, in the first embodiment, the drain contact DC is formed such that the upper surface UF2 of the drain contact DC becomes higher than the upper surface UF1 of the switching transistors Tr1 and Tr2. Accordingly, no influence of both or either one of the void 60 and the seam 70 of the drain contact DC is present on the upper surface UF2 of the upper connector 200. As a result, the MTJ element can be arranged substantially horizontally on the surface of the semiconductor substrate 10. Consequently, no bias stress is applied to the MTJ element, and a satisfactory electric property or a satisfactory magnetic property of the MTJ element can be held.

FIGS. 4 to 9 are cross-sectional views showing a manufacturing method of an MRAM according to the first embodiment. The manufacturing method of an MRAM according to the first embodiment is explained below with reference to FIGS. 4 to 9.

First, the switching transistors Tr1 and Tr2 are formed on the silicon substrate 10. The switching transistors Tr1 and Tr2 can be formed by a method similar to a known formation method of transistors. However, a tungsten layer formed on a gate G functions as the word line WL. Therefore, one word line WL is extended to the first direction, and is connected to gates G of plural memory cells MC arranged in the first direction.

Figure 4:
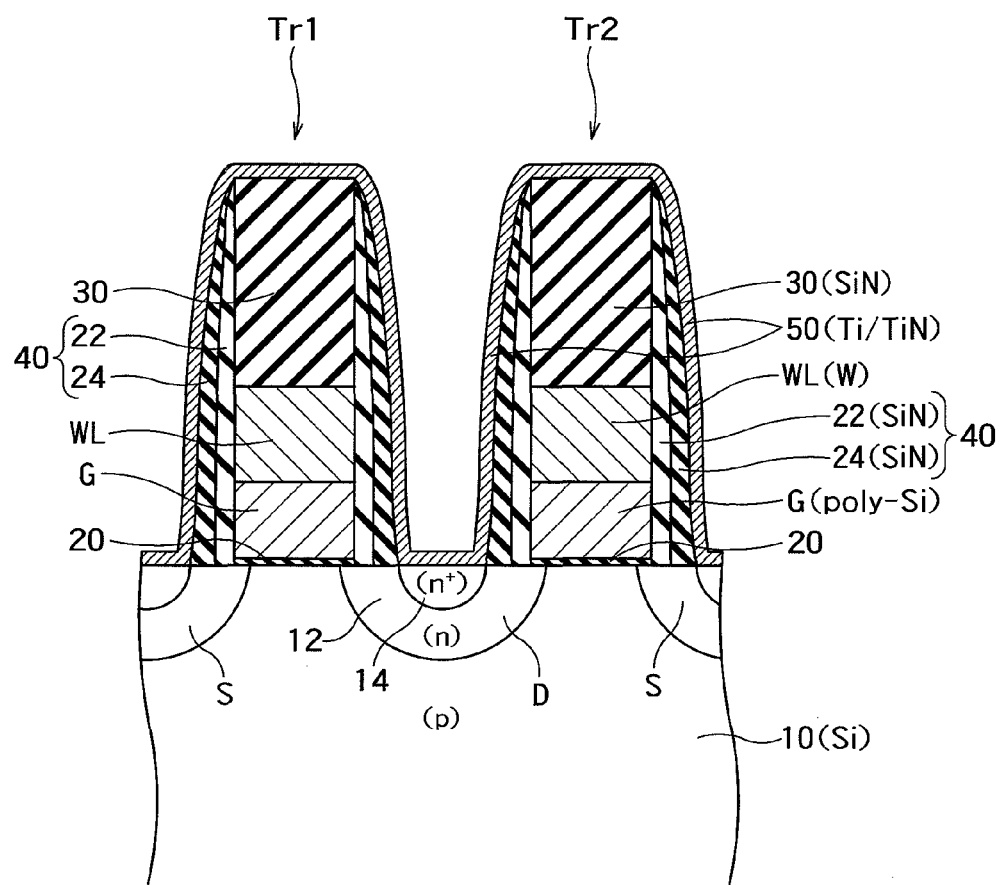
FIGS. 4 to 9 are cross-sectional views showing a manufacturing method of an MRAM according to the first embodiment.

Each extension layer 12 of the source layer S and the drain layer D is formed by introducing an impurity by using as a mask a sidewall film 22 formed on side surfaces of the gate G, the word line WL, and the protection film 30. Each high concentration layer 14 of the source layer S and the drain layer D is formed by introducing an impurity by using as a mask a sidewall film 24 provided via the sidewall film 22 on the side surfaces of the gate G, the word line WL, and the protection film 30. Therefore, as shown in FIG. 4, the switching transistors Tr1 and Tr2 adjacent to each other share the source layer S or the drain layer D. For example, the switching transistors Tr1 and Tr2 share the drain layer D. The sidewall films 22 and 24 are constituted by a silicon nitride film, for example, and are shown by a reference numeral 40 in FIG. 3.

Next, the barrier film 50 is deposited to cover the switching transistors Tr1 and Tr2 and the sidewall film 40. Accordingly, a structure shown in FIG. 4 is obtained.

Figure 5:
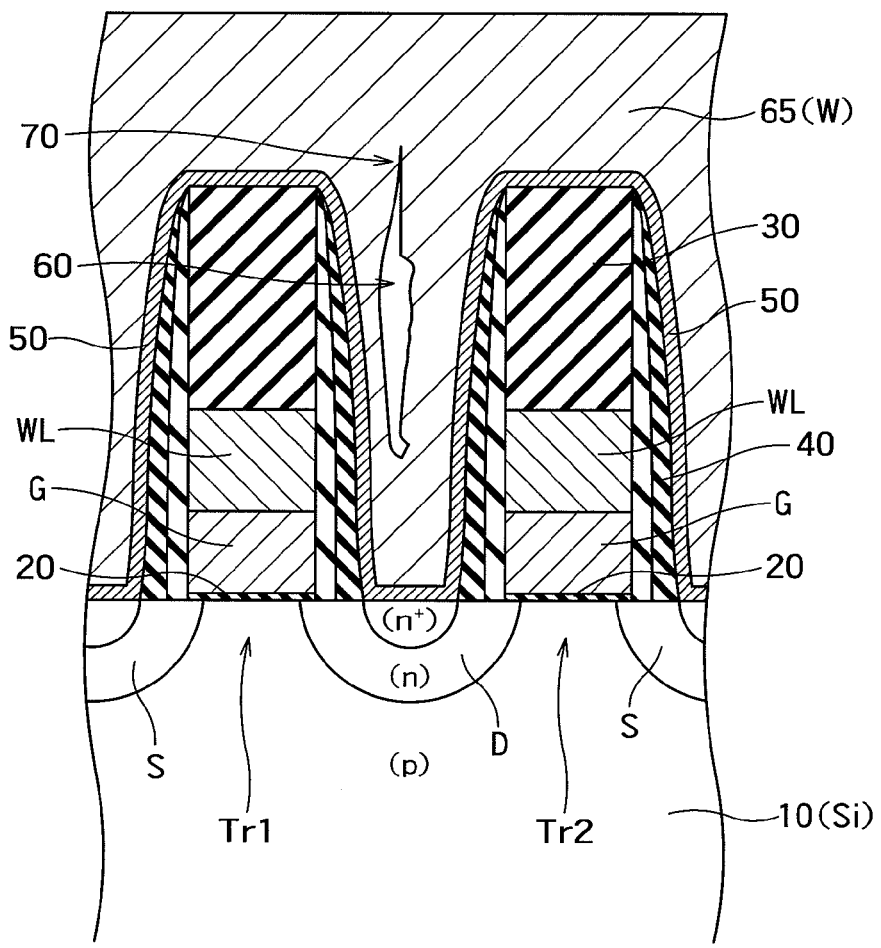

Next, as shown in FIG. 5, tungsten, for example, is deposited on the barrier film 50, as a material (hereinafter, also "plug material") 65 of the drain contact DC and the source contact SC1. In this case, the plug material 65 is embedded between the switching transistors Tr1 and Tr2 adjacent to each other in the second direction. The plug material 65 is also deposited on the upper surface UF1 of the switching transistors Tr1 and Tr2. Generally, an interval between the switching transistors Tr1 and Tr2 is set small to downscale a device, and the gate G and the word line WL are formed thick to reduce resistances of the gate G and the word line WL. Therefore, an aspect ratio of a trench between the switching transistors Tr1 and Tr2 is large. Accordingly, as shown in FIG. 5, both or either one of the void 60 and the seam 70 occurs in the plug material 65 between the switching transistors Tr1 and Tr2. In this deposition process, the plug material 65 is also embedded in the source layer S.

Figure 6:
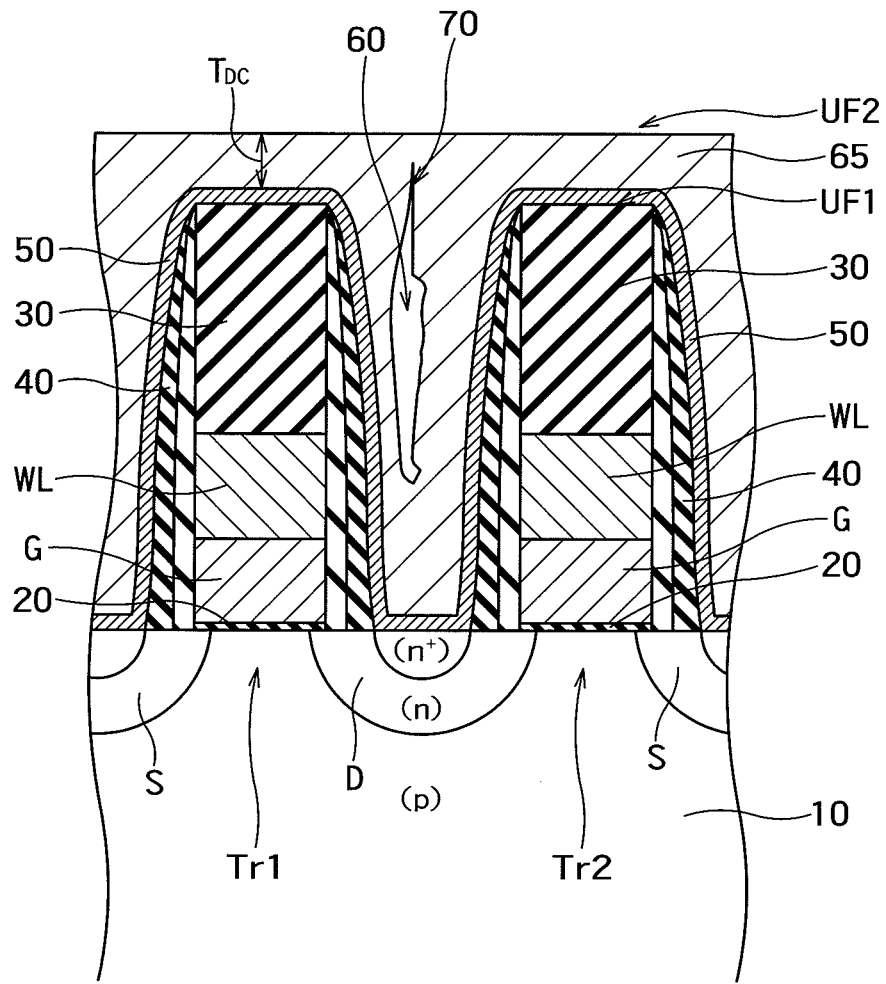

Next, as shown in FIG. 6, a surface of the plug material 65 is flattened by using CMP. In this case, the plug material 65 and the barrier film 50 are left on the upper surface UF1 of the switching transistors Tr1 and Tr2.

Conventionally, a plug material is polished until when an upper surface of switching transistors is exposed.

In this case, because the plug material 65 and the barrier film 50 on the upper surface of the switching transistors are removed, contact plugs embedded between adjacent switching transistors are mutually electrically isolated. In this case, a height of the upper surface of the contact plugs becomes the same as that of an upper surface of the switching transistors.

On the other hand, in the first embodiment, because the plug material 65 and the barrier film 50 are left on the upper surface UF1 of the switching transistors Tr1 and Tr2, the drain contact DC and the source contact SC1 embedded between adjacent switching transistors are still in an electrically connected state at this stage. However, after processing by CMP, a surface of the plug material 65 (the upper surface UF2 of the drain contact DC) is at a position sufficiently higher than the void 60. Therefore, the void 60 or the seam 70 occurs little on the surface of the plug material 65, and the surface of the plug material 65 has satisfactory roughness. That is, the roughness of the surface of the plug material 65 is smaller than conventional roughness. For example, after the CMP process, a thickness $T_{DC}$ of the drain contact DC on the switching transistors Tr1 and Tr2 is 5 nm to 40 nm, for example. In this case, the roughness of the surface of the plug material 65 is equal to or smaller than 0.2 nm, for example.

Figure 7:
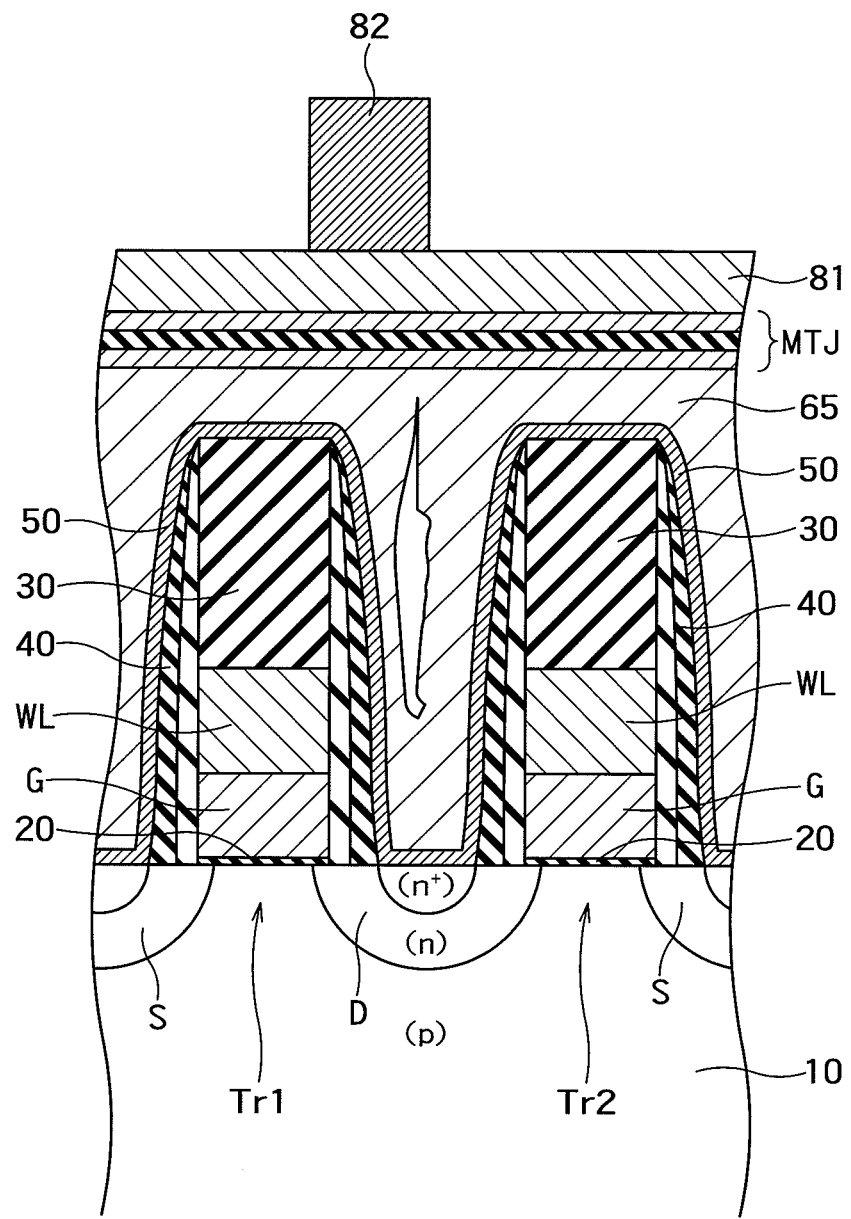

Next, as shown in FIG. 7, materials of the MTJ element are deposited on the plug material 65 in the order of a material of a fixed layer, a material of a tunnel barrier film, and a material of a recording layer. A material of the fixed layer is a magnetic layer including Co, Fe, Ni, Pt, Fe, Pd, B, Ta, Dy, Tv, and Cr, for example. A material of the tunnel barrier film is magnesium oxide, for example, and a material of the recording layer is a magnetic layer including Co, Fe, Ni, Pt, Fe, Pd, B, Ta, Dy, Tv, and Cr, for example.

Next, a material of a hardmask 81 is deposited on the materials of the MTJ element. A material of the hardmask 81 is a single-layer film or a laminated film of $SiO_2$, SiN, Ta, TiAlxNy, TaN, TiN, WN, W, and $Al_2O_3$, for example. When the hardmask 81 is a laminated film, a material of the hardmask 81 is preferably a conductive material (Ta, TiAlxNy, TaN, WN, W, and TiN, for example) to be able to be used as the electrode 80 shown in FIG. 3. When the hardmask 81 is a laminated film, a material of the hardmask 81 is arranged such that a conductive material is deposited on at least the MTJ element, and an insulation material ($SiO_2$, SiN, and $Al_2O_3$, for example) is deposited on this conductive material. The insulation material of the hardmask 81 is removed simultaneously with etching of the MTJ element and the drain contact DC of the upper connector. In the first embodiment, a laminated film of $SiO_2$ and Ta formed by plasma TEOS, or a laminated film of $SiO_2$, Ta, and TiAlN is employed for the material of the hardmask 81. In this case, Ta or TiAlN is first deposited on the upper surface UF2 of the MTJ element, and $SiO_2$ is deposited thereafter.

Next, a photoresist 82 is deposited on the hardmask 81, and the photoresist 82 is patterned in a layout of the MTJ element by a lithography process. As a result, a structure shown in FIG. 7 is obtained.

Figure 8:
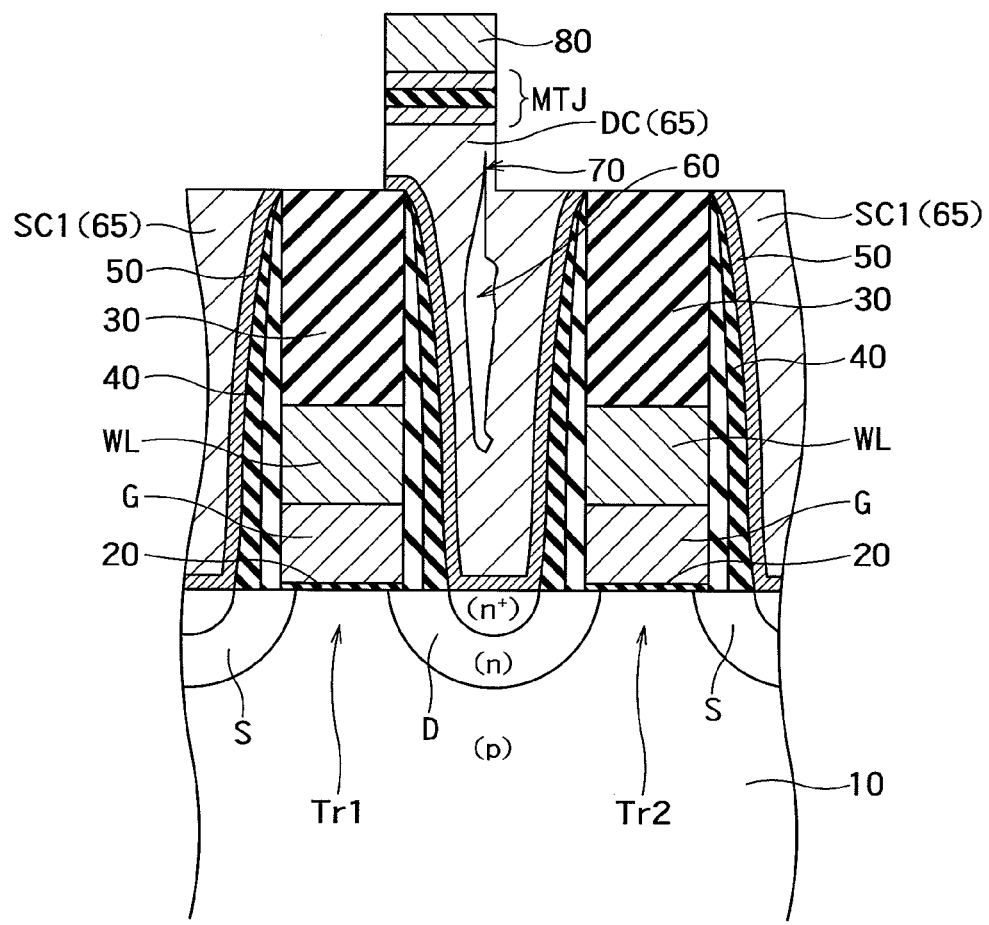
Figure 9:
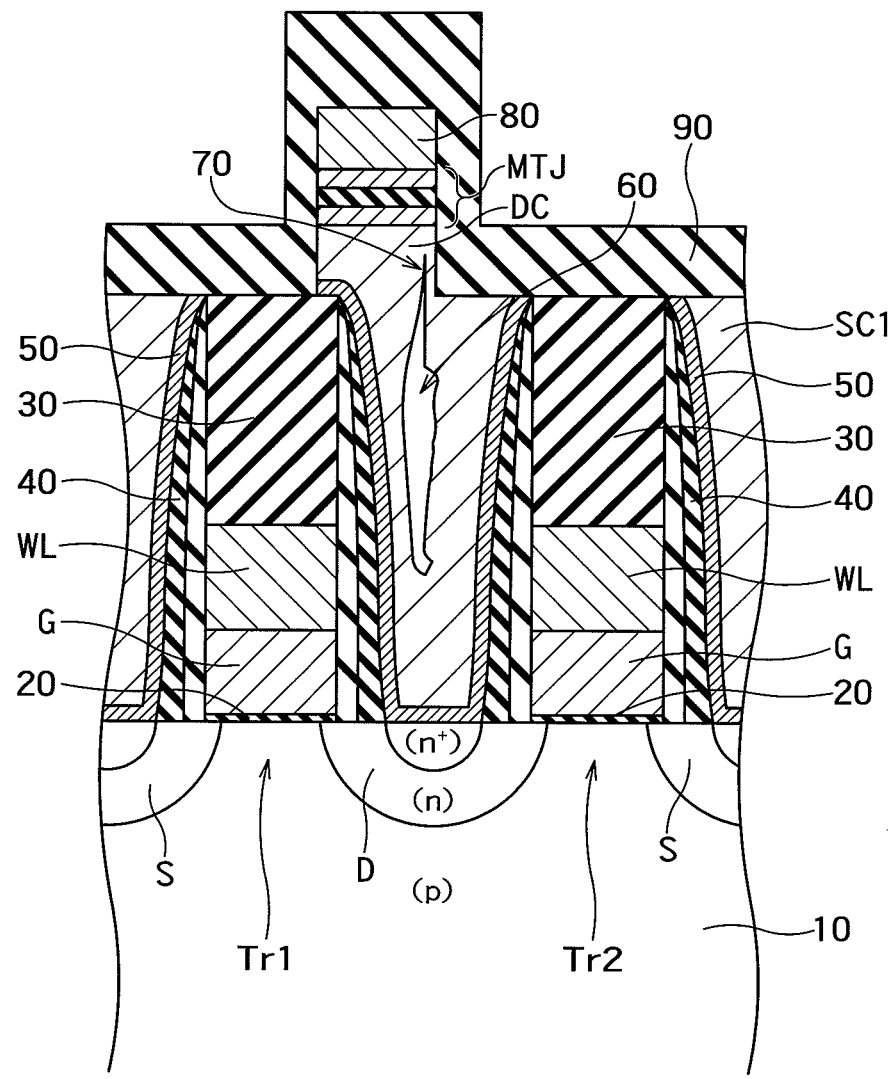

As shown in FIGS. 8 and 9, the MTJ element is slightly deviated to a switching transistor Tr1 side. This shows that the MTJ element is not inclined even if a position of the MTJ element is slightly deviated.

Next, the hardmask 81 is etched by RIE by using the photoresist 82 as a mask. Further, a material of the MTJ element, the plug material 65, and the barrier film 50 are continuously etched by using the hardmask 81 as a mask, until when the upper surface UF1 of the switching transistors Tr1 and Tr2 is exposed. As a result, a structure shown in FIG. 8 is obtained. Because the material of the MTJ element, the plug material 65, and the barrier film 50 are continuously etched by the same process, a plane layout of the upper surface UF2 of the drain contact DC becomes the same as a plane layout of the MTJ element. An upper insulation material of the hardmask 81 is removed by this etching process. Accordingly, the hardmask 81 is hereinafter called the electrode 80. The source contact SC1 is also processed in a similar manner to that of the drain contact DC by this etching process. However, because the MTJ element and the hardmask 81 are not provided on the source contact SC1, the upper surface of the source contact SC1 is etched at substantially the same height of the upper surface UF1 of the switching transistors Tr1 and Tr2. In some cases, due to overetching, a part of the upper surface UF1 of the switching transistors Tr1 and Tr2 is etched, and a height of the upper surface of the source contact SC1 is deviated from the height of the upper surface UF1 of the switching transistors Tr1 and Tr2.

The material of the MTJ element can be also etched by using RIE, high-temperature RIE at 150° C. to 400° C., and IBE (Ion Beam Etching). Further, the material of the MTJ element can be etched by combining plural methods among RIE, high-temperature RIE and IBE. For example, in the first embodiment, the material of the MTJ element is processed by IBE, and the material of the drain contact DC and the material of the barrier film 50 are processed by RIE. Damage caused to the MTJ element can be further reduced by processing by IBE all of the material of the MTJ element, the plug material 65, and the material of the barrier film 50.

After processing the material of the MTJ element, the plug material 65, and the barrier film 50, the MTJ element can be recovered from damage and a current leakage from the tunnel barrier film can be reduced by performing plasma processing at a low temperature of 100° C. to 200° C.

Next, as shown in FIG. 9, the protection film 90 is deposited on side surfaces of the MTJ element and the drain contact DC, on an upper surface and a side surface of the electrode 80, and on the upper surface UF1 of the switching transistors Tr1 and Tr2, respectively. The protection film 90 is a single-layer film of any one of SixNy, $Al_2O_3$, AlxOy (x<2, y=3), $SiO_2$, SiAlxOy, $TiO_2$, and $ZrO_2$, or a laminated film of two or more kinds of these materials. The protection film 90 can be formed by any of a sputtering method, an oblique-incidence deposition method, an ALD (Atomic Layer Deposition) method. In the first embodiment, the protection film 90 is formed by depositing a silicon nitride film by about 20 nm by using the sputtering method, for example. The protection film 90 can be also formed by depositing AlxOy (x<2, y=3) by about 5 nm by using the sputtering method (or the oblique-incidence deposition method), and by further depositing an $Al_2O_3$ film by about 15 nm on this deposition by using the ALD method.

Next, the interlayer dielectric film ILD1 is deposited on the protection film 90. The interlayer dielectric film ILD1 is polished by CMP until when a surface of the electrode 80 is exposed. The local interconnect LIC is formed on the electrode 80, and the interlayer dielectric film ILD2 is deposited to cover the local interconnect LIC. Thereafter, the source contact SC2, the bit line contact BC, the source line SL, and the bit line BL are formed as shown in FIG. 3, thereby completing the MRAM according to the first embodiment. The source contact SC2 is formed to be connected to the source contact SC1, and the source line SL is formed to be connected to the source contact SL2.

The bit line contact BC, although not shown in FIG. 3, is formed simultaneously with the source contact SC2, and is formed to reach the local interconnect LIC (see FIG. 2). The bit line BL, although not shown in FIG. 3, is also formed simultaneously with the source line SL, and is formed to be connected to the bit line contact BC.

According to the first embodiment, the material of the drain contact DC as a contact plug is not polished up to the upper surface UF1 of the switching transistors Tr1 and Tr2. Therefore, the drain contact DC is not only embedded between adjacent switching transistors Tr1 and Tr2 but is also integrally formed to reach a level higher than the upper surface UF1 of the switching transistors Tr1 and Tr2. Accordingly, both or either one of the void 60 and the seam 70 is absent in the drain contact DC. The MTJ element is substantially horizontal with the surface of the semiconductor substrate 10, and can be formed on the upper surface UF2 of the drain contact DC having satisfactory flatness. As a result, satisfactory reliability of the MTJ element can be maintained. In some cases, a crystal grain boundary due to the void 60 and the seam 70 remains on the upper surface UF2 of the drain contact DC. However, a crystal grain boundary causing no influence on the flatness does not affect an electric property and a magnetic property of the MTJ element.

The drain contact DC and the barrier film 50 are processed in the same pattern as that of the layout of the MTJ element by using the hardmask 81 as a mask. Accordingly, not only the drain contact DC but also the barrier film 50 is removed at least at one portion of the upper surface UF1 of the switching transistors Tr1 and Tr2. As a result, adjacent contact plugs (the drain contact DC and the source contact SC1) are electrically isolated. Because the barrier film 50 remains beneath the drain contact DC, this can play a role of preventing diffusion of the plug material 65 (tungsten, for example) and protecting the silicon substrate 10.

Like conventional techniques, when the plug material 65 is polished by CMP to the height of the upper surface UF1 of the switching transistors Tr1 and Tr2, a boundary of the protection film 30 and the drain contact DC does not easily become flat because the material (a silicon nitride film, for example) of the protection film 30 is different from the plug material 65 (tungsten, for example). When the MTJ element is formed across the boundary of the protection film 30 and drain contact DC, this has a possibility of causing a negative influence on the electric property and the magnetic property of the MTJ element due to misalignment of lithography.

On the other hand, in the first embodiment, the drain contact DC is integrally formed at a higher level than that of the upper surface UF1 of the switching transistors Tr1 and Tr2. Accordingly, as shown in FIG. 3, even when the MTJ element is formed across the boundary of the protection film 30 and the drain contact DC, satisfactory flatness of the upper surface UF2 of the upper connector 200 can be held. As a result, as shown in FIG. 7, even when the photoresist 82 is misaligned, the MTJ element is not inclined, and high reliability of the MRAM can be maintained.

Second Embodiment

Figure 10:
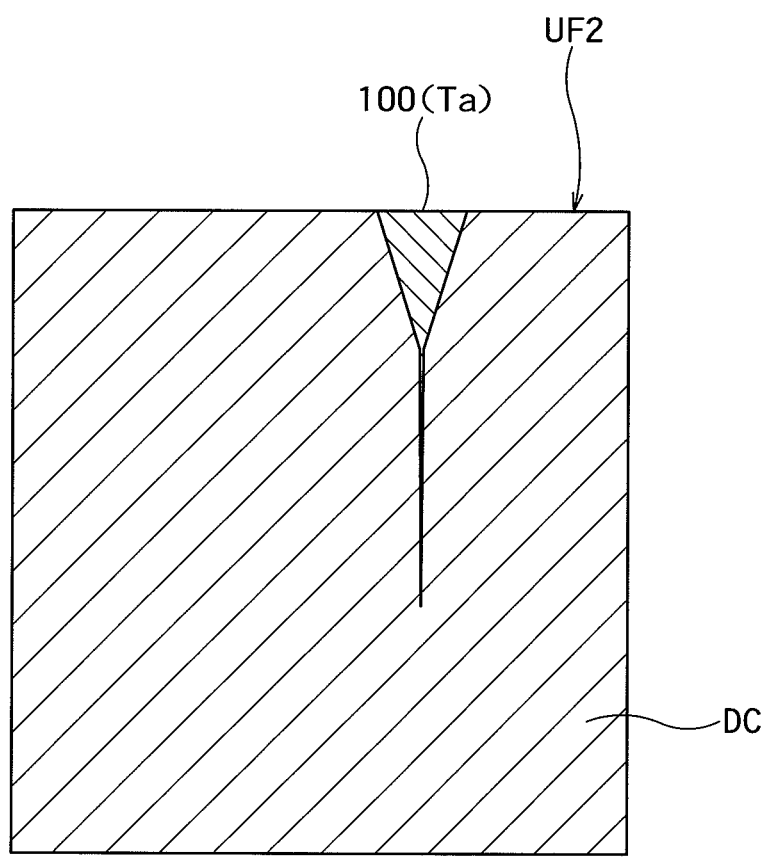
FIG. 10 is a cross-sectional view showing a part of a drain contact DC of an MRAM according to a second embodiment.

FIG. 10 is a cross-sectional view showing a part of a drain contact DC of an MRAM according to a second embodiment. In the first embodiment, a crystal grain boundary attributable to the void 60 or the seam 70 causes little influence on the properties of the MTJ element. However, in the second embodiment, this crystal grain boundary is embedded with a metal material to reduce the influence of the crystal grain boundary of the upper surface UF2 of the drain contact DC. A metal material embedding the crystal grain boundary can be Ta which is the same material as that of the fixed layer of the MTJ element, for example. Accordingly, the properties of the MTJ element do not receive any negative influence by the crystal grain boundary.

A manufacturing method according to the second embodiment is as follows. After a process shown in FIG. 6, a tantalum film is deposited by about 40 m, and this tantalum film is polished by CMP, for example. Accordingly, a crystal grain boundary of the upper surface UF2 can be embedded by tantalum. Other processes in the manufacturing method in the second embodiment can be identical to those in the first embodiment.

According to the second embodiment, more satisfactory flatness of the upper surface UF2 of the drain contact DC can be held. Therefore, reliability of the MTJ element can be more increased in the second embodiment. Further, because other configurations of the second embodiment are identical to corresponding ones of the first embodiment, the second embodiment can also obtain effects of the first embodiment.

Third Embodiment

In a case that the plug material 65 is etched after the material of the MTJ element is etched, the plug material 65

(tungsten, for example) is sometimes adhered to the side surface of the MTJ element. Because the plug material 65 is conductive, there is a possibility of short-circuiting between the fixed layer and the recording layer when the plug material 65 is adhered to the side surface of the tunnel barrier film of the MTJ element. Further, a width of the MTJ element becomes large when the plug material 65 is adhered to the side surface of the MTJ element.

According to a third embodiment of the present invention, a material of an MTJ element is etched after the plug material 65 is etched. The MTJ element covers the entirety of the upper surface UF2 of the drain contact DC, and the drain contact DC is not exposed when etching the material of the MTJ element. A manufacturing method of an MRAM according to the third embodiment is explained in more detail with reference to FIGS. 11 to 16.

Figure 11:
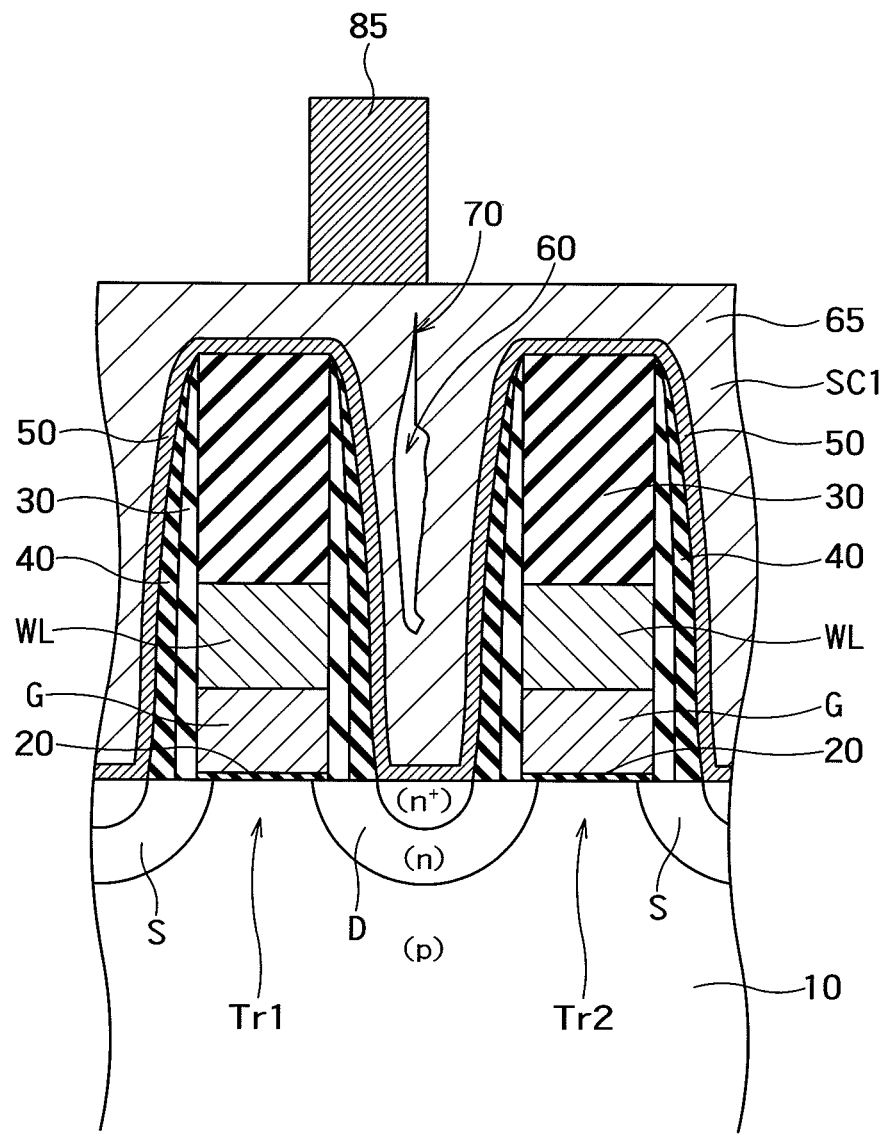
FIGS. 11 to 16 are cross-sectional views showing a manufacturing method of an MRAM according to the third embodiment.

After finishing processes shown in FIGS. 4 to 6, a first mask material 85 is formed on the plug material 65 as shown in FIG. 11. The first mask material 85 is processed to remain on the plug material 65 between adjacent two switching transistors Tr1 and Tr2. That is, the first mask material 85 is processed in a pattern of the drain contact DC. The first mask material 85 is a laminated film having an organic material film, a silicon compound, and a photoresist deposited in this order, for example.

Figure 12:
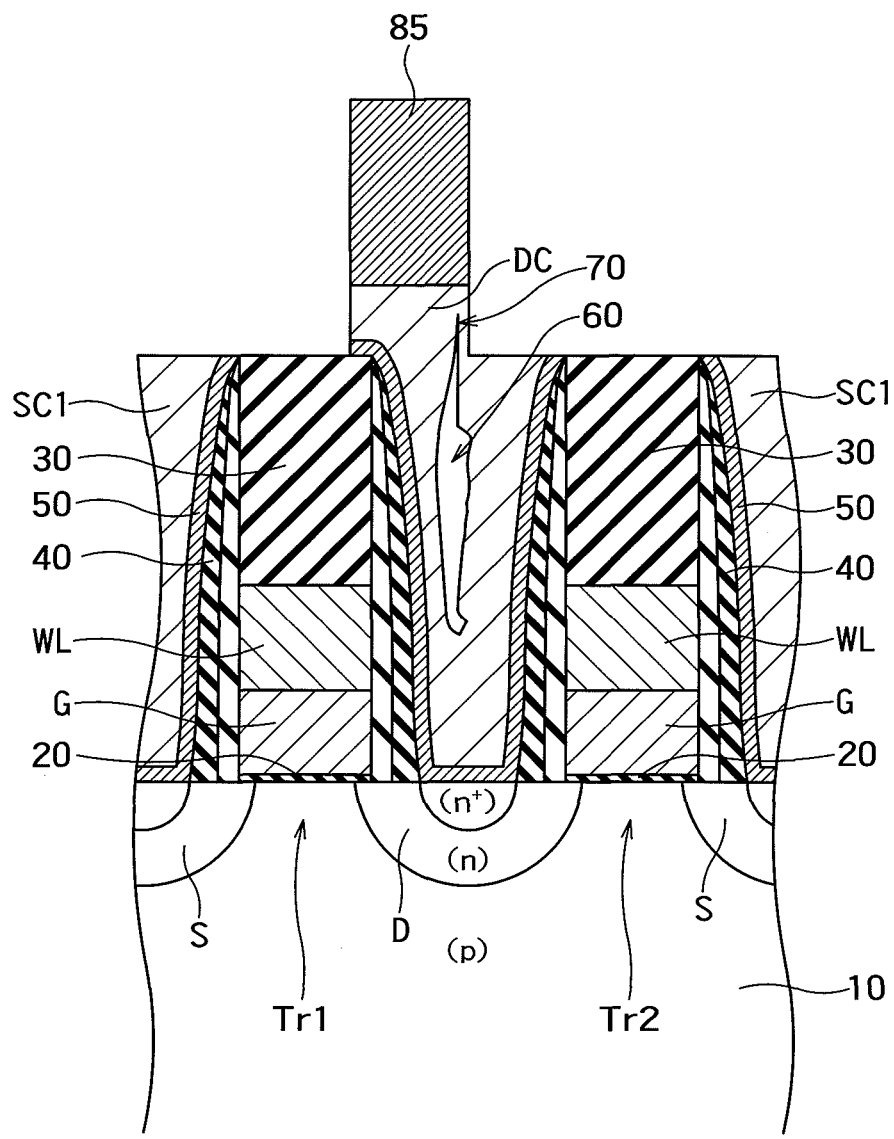

Next, as shown in FIG. 12, the plug material 65 and the barrier film 50 are etched by RIE by using the first mask material 85 as a mask, and the upper surface UF1 of the switching transistors Tr1 and Tr2 is exposed. The source contact SC1 connected to the drain contact DC and the source layer S electrically connected to the drain layer D are formed by this etching process.

Figure 13:
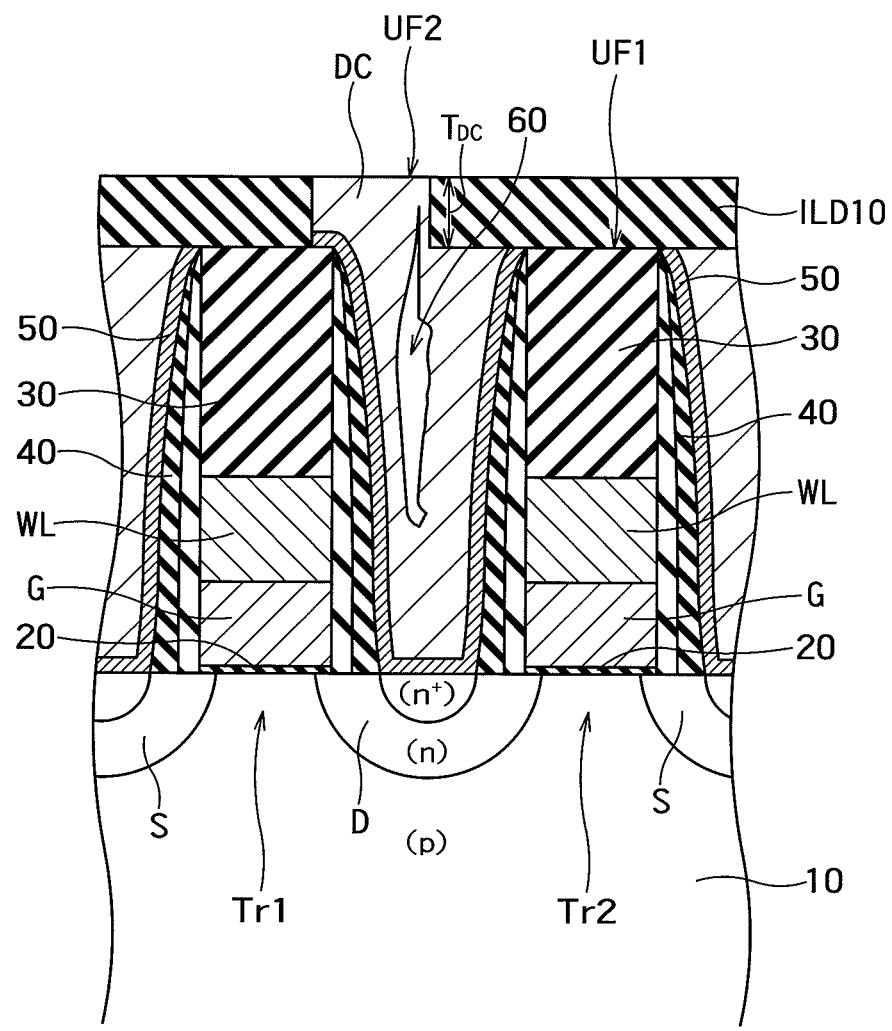

Next, after the first mask material 85 is removed, an interlayer dielectric film ILD10 is deposited to cover the drain contact DC and the source contact SC1. The interlayer dielectric film ILD10 is polished by using CMP, until when the upper surface UF2 of the drain contact DC is exposed. As a result, a structure shown in FIG. 13 is obtained. In this case, a height $T_{DC}$ of the upper surface UF2 based on the upper surface UF1 is 5 nm to 40 nm, for example, like the height of the upper surface UF2 based on the upper surface UF1 in the first embodiment. The roughness of the upper surface UF2 is equal to or smaller than 0.2 nm like in the first embodiment, for example.

Figure 14:
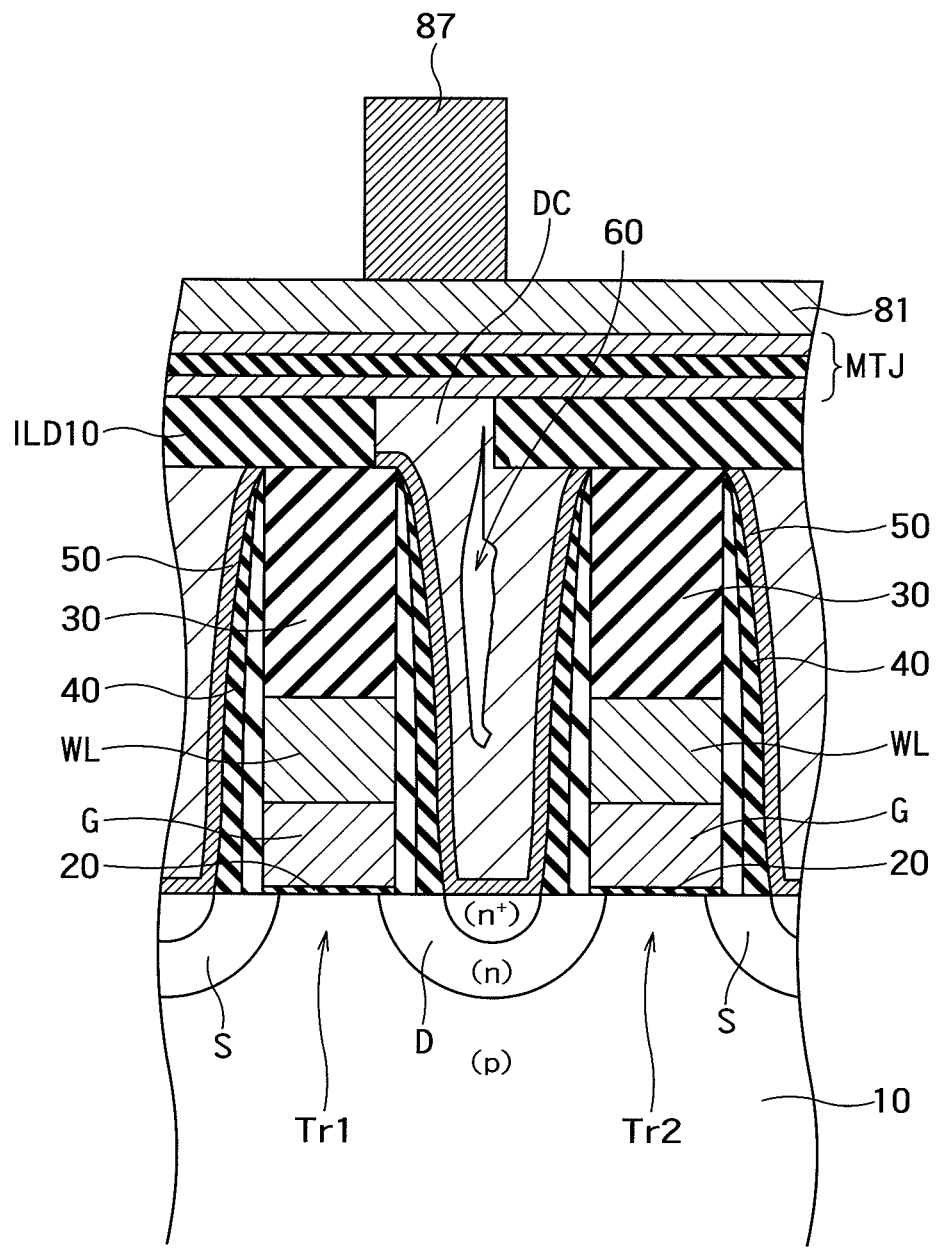

Next, as shown in FIG. 14, a material of the hardmask 81 as a material of an MTJ element and the second mask material is deposited on the drain contact DC and the interlayer dielectric film ILD10.

The material of the MTJ element and the material of the hardmask 81 can be identical to those in the first embodiment. Deposition methods of the material of the MTJ element and the material of the hardmask 81 can be also identical to corresponding methods in the first embodiment.

Figure 15:
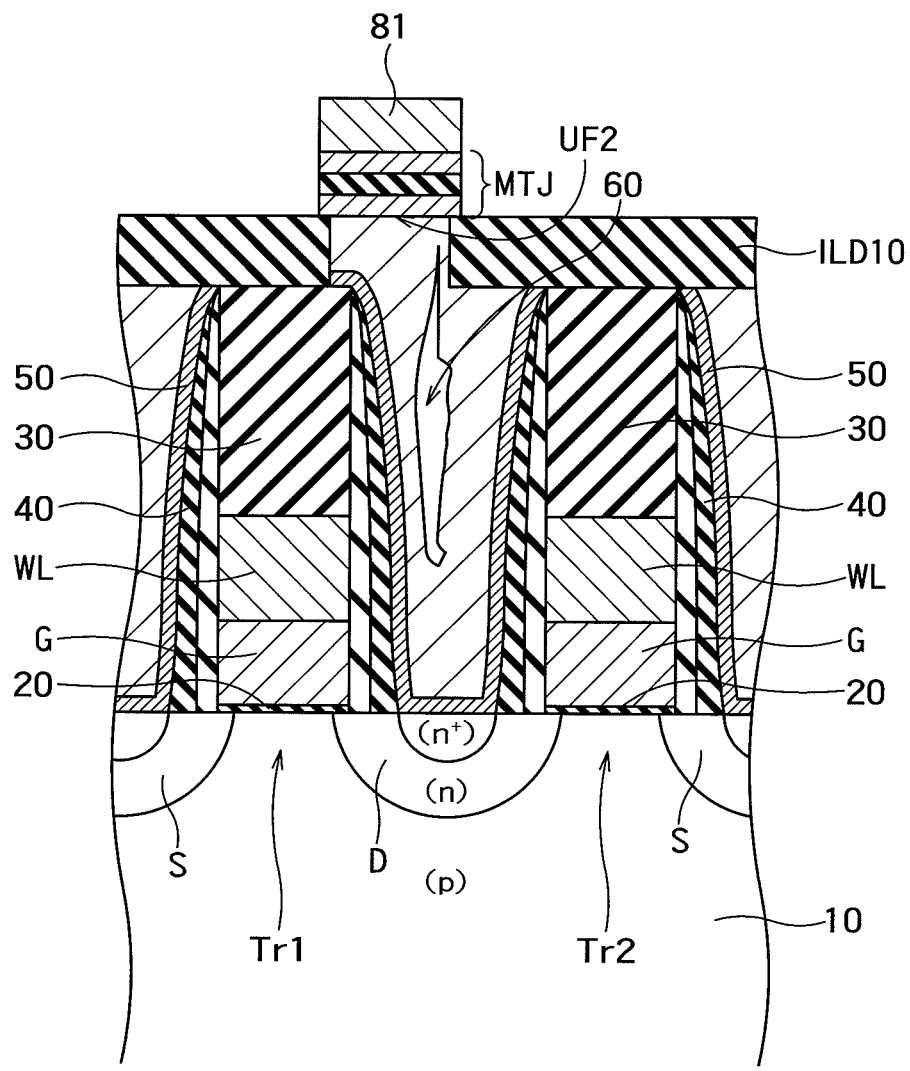

Next, a photoresist 87 is deposited on the material of the hardmask 81, and a pattern of a layout of the MTJ element is formed. The layout of the MTJ element is formed wider than a layout of the first mask material 85 not to expose the drain contact DC when etching the material of the MTJ element. The material of the hardmask 81 is etched by RIE by using the photoresist 87 as a mask. The material of the MTJ element is etched by using the hardmask 81 as a mask. As a result, a structure shown in FIG. 15 is obtained. An etching method of the material of the MTJ element and an etching method of the material of the hardmask 81 can be identical to corresponding methods in the first embodiment.

The layout of the MTJ element is formed wider than the layout of the first mask material 85, that is, a layout of the upper surface UF2 of the drain contact DC. Accordingly, a bottom surface of the MTJ element has a larger area than that of the upper surface UF2 of the drain contact DC, and the MTJ element covers the entirety of the upper surface UF2 of the drain contact DC when etching the material of the MTJ element. Therefore, the material (tungsten, for example) of the drain contact DC is not exposed when etching the material of the MTJ element. As a result, adhesion of the material of the drain contact DC to the side surface of the MTJ element can be prevented, and a current leakage between the fixed layer and the recording layer of the MTJ element can be suppressed. Because adhesion of the material of the drain contact DC to the side surface of the MTJ element can be prevented, increase of the size of the MTJ element can be suppressed.

Figure 16:
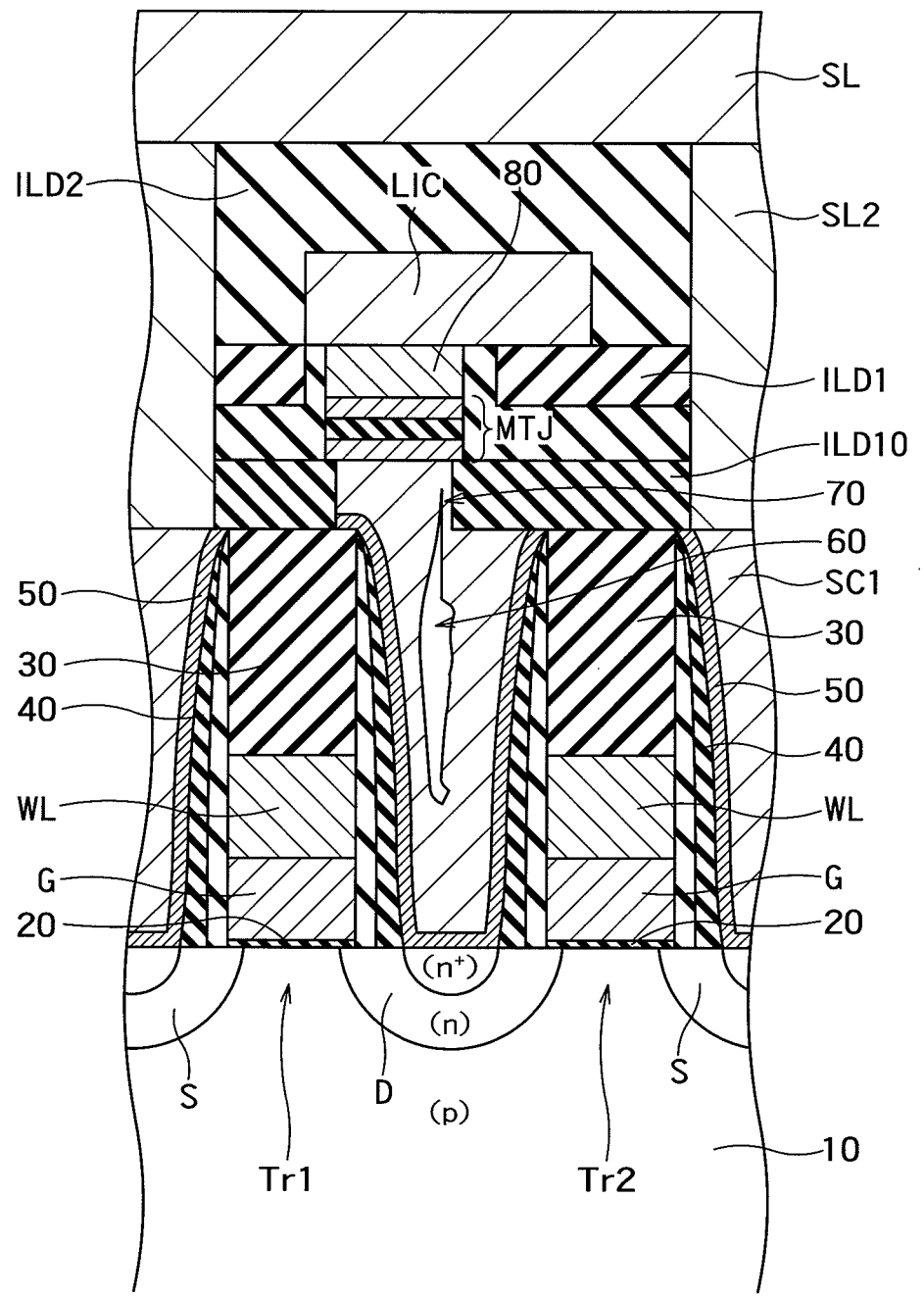
Figure 17:
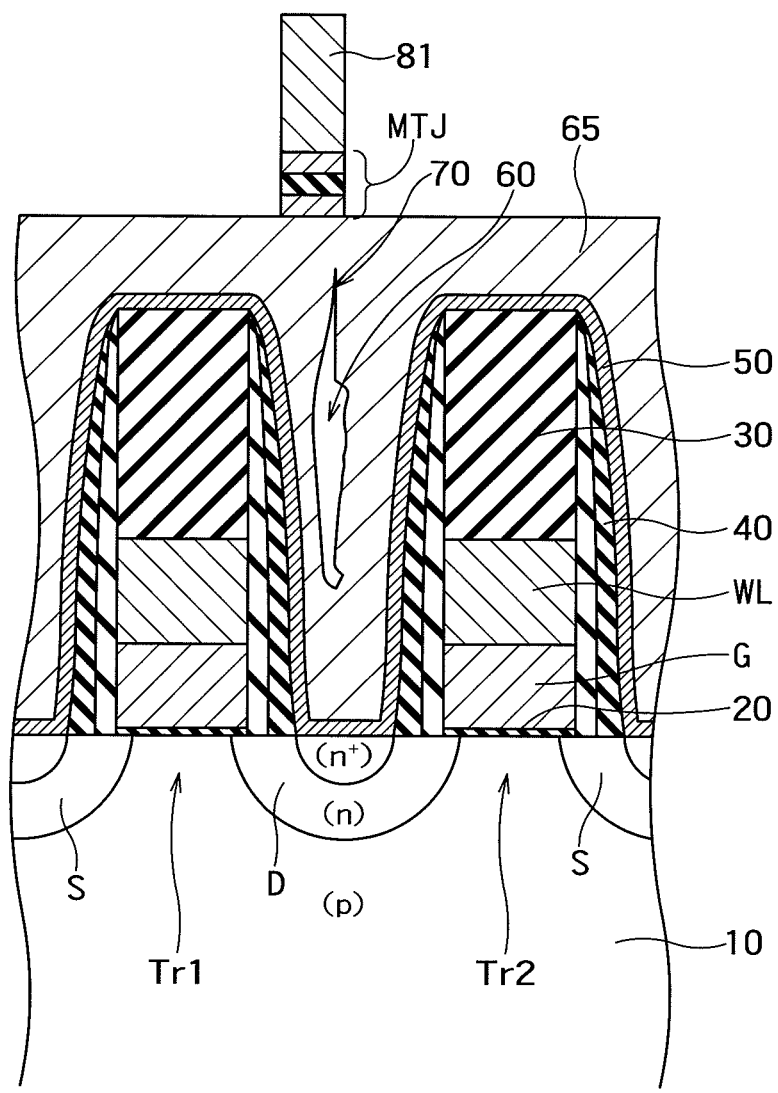
FIGS. 17 to 20 are cross-sectional views showing a manufacturing method of an MRAM according to the forth embodiment.

Thereafter, the interlayer dielectric film ILD1, the local interconnect LIC, the interlayer dielectric film ILD2, the source contact SC2, and the source line SL are formed by a method identical to the manufacturing method according to the first embodiment. Consequently, the MRAM according to the third embodiment is completed as shown in FIG. 16. The MRAM according to the third embodiment is different from that in the first embodiment in that the MTJ element covers the entirety of the upper surface UF2 of the drain contact DC and that the interlayer dielectric film ILD10 is provided. Other configurations of the third embodiment can be identical to corresponding ones of the first embodiment.

In the third embodiment, the MTJ element is formed after etching the plug material 65. Further, the bottom surface of the MTJ element covers the upper surface UF2 of the drain contact DC when etching the material of the MTJ element. Accordingly, the plug material 65 (tungsten, for example) is not adhered to the side surface of the MTJ element, and a current leakage between the fixed layer and the recording layer of the MTJ element can be suppressed. Further, because the plug material 65 is not adhered to the side surface of the MTJ element, increase of the size of the MTJ element can be suppressed.

In the third embodiment, the upper surface UF2 of the drain contact DC is also at a position higher than the upper surface UF1 of the switching transistors Tr1 and Tr2. Therefore, the third embodiment can be combined with the second embodiment, and thus the third embodiment can also obtain effects of the second embodiment.

Fourth Embodiment

The size of the MTJ element is preferably as small as possible from a viewpoint of power consumption. On the other hand, when the size of the MTJ element is set smaller than that of the upper surface UF2 of the drain contact DC, the plug material 65 near the MTJ element is excessively etched by trenching in an etching process of the plug material 65 according to the manufacturing methods in the first and second embodiments. This excessive etching causes the seam 70 and the void 60 in the plug material 65 to be exposed, and this becomes a cause of inclining the MTJ element. Exposure of the seam 70 and the void 60 has a possibility of generating abnormal discharge of plasma CVD, or a possibility of embedding a residual in the seam 70 or the void 60 in wet processing after the etching. These all become a cause of a fault, and lower a yield. The trenching of the plug material 65 is a phenomenon of increasing an etching rate of the plug material 65 due to a reflection of ions to side surfaces the hardmask 81 and the MTJ element when etching the plug material 65.

Thus, in a fourth embodiment of the present invention, a sidewall is provided on a side surface of an MTJ element, thereby reducing the size of the MTJ element and reducing power consumption of the MTJ element.

FIGS. 17 to 20 are cross-sectional views showing a manufacturing method of an MRAM according to the forth embodiment. After finishing the processes shown in FIGS. 4 to 6, the hardmask 81 and the MTJ element are deposited. The hardmask 81 and the MTJ element are processed by using lithography and RIE (or IBE). In this case, deposition methods of the hardmask 81 and the MTJ element can be identical to corresponding methods in the first embodiment. Etching methods of the hardmask 81 and the MTJ element can be identical to corresponding methods in the first embodiment.

The hardmask 81 and the MTJ element are formed narrower than an interval between adjacent switching transistors Tr1 and Tr2. An area of a bottom surface of the MTJ element is smaller than an area of the upper surface UF2 of the drain contact DC formed in a later process.

Figure 18:
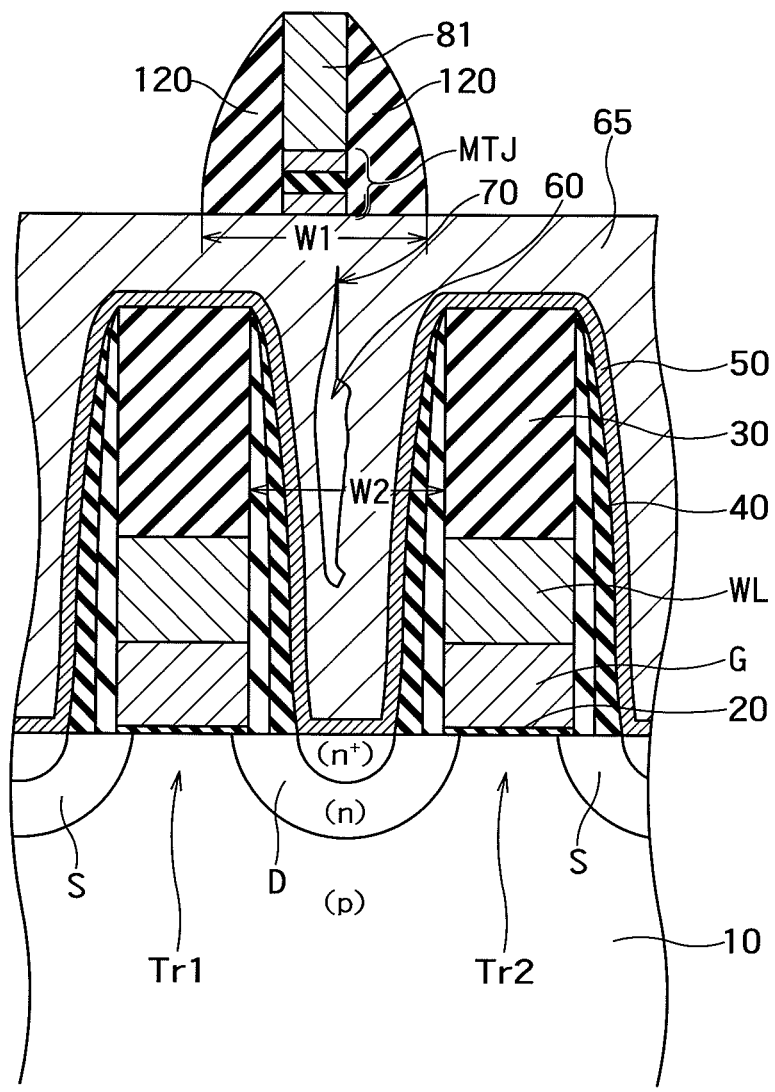

Next, a material of a sidewall film 120 is deposited, and the material of the sidewall film 120 is anisotropically etched back by RIE as shown in FIG. 18. The material of the sidewall film 120 is a silicon oxide film, a silicon nitride film, an aluminum oxide film, a magnesium oxide film, or an insulation material having these films mixed, for example. Accordingly, the sidewall film 120 is left on side surfaces of the MTJ element and the hardmask 81. In this case, a width W1 of bottom surfaces of the sidewall film 120 and the MTJ element is equal to or slightly larger than an interval W2 between the adjacent switching transistors Tr1 and Tr2.

Figure 19:
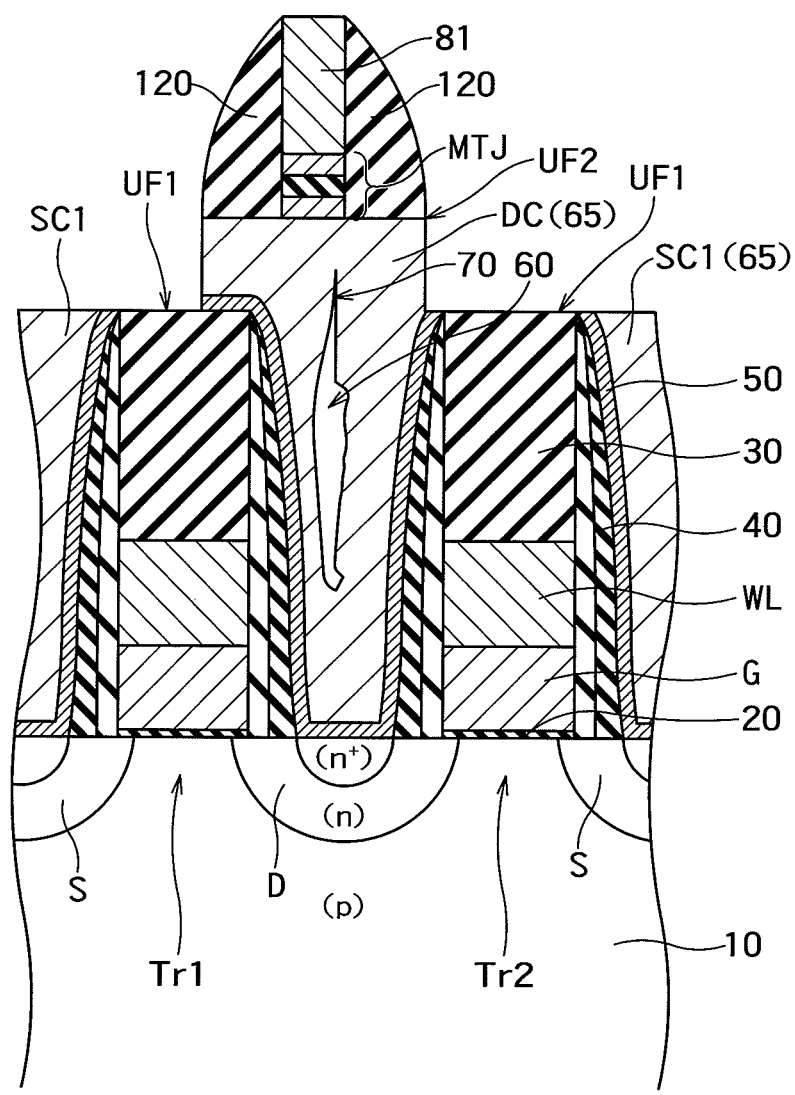

Next, the plug material 65 and the barrier film 50 are etched by RIE by using the hardmask 81 and the sidewall film 120 as a mask as shown in FIG. 19. Accordingly, the upper surface UF1 of the switching transistors Tr1 and Tr2 is exposed, and the drain contact DC and the source contact SC1 are electrically isolated. In this case, because the sidewall film 120 covers the side surface of the MTJ element, both or either one of the plug material 65 and the barrier film 50 is not adhered to the side surface of the MTJ element. Therefore, electrical short-circuiting between the fixed layer and the recording layer of the MTJ element can be suppressed.

Figure 20:
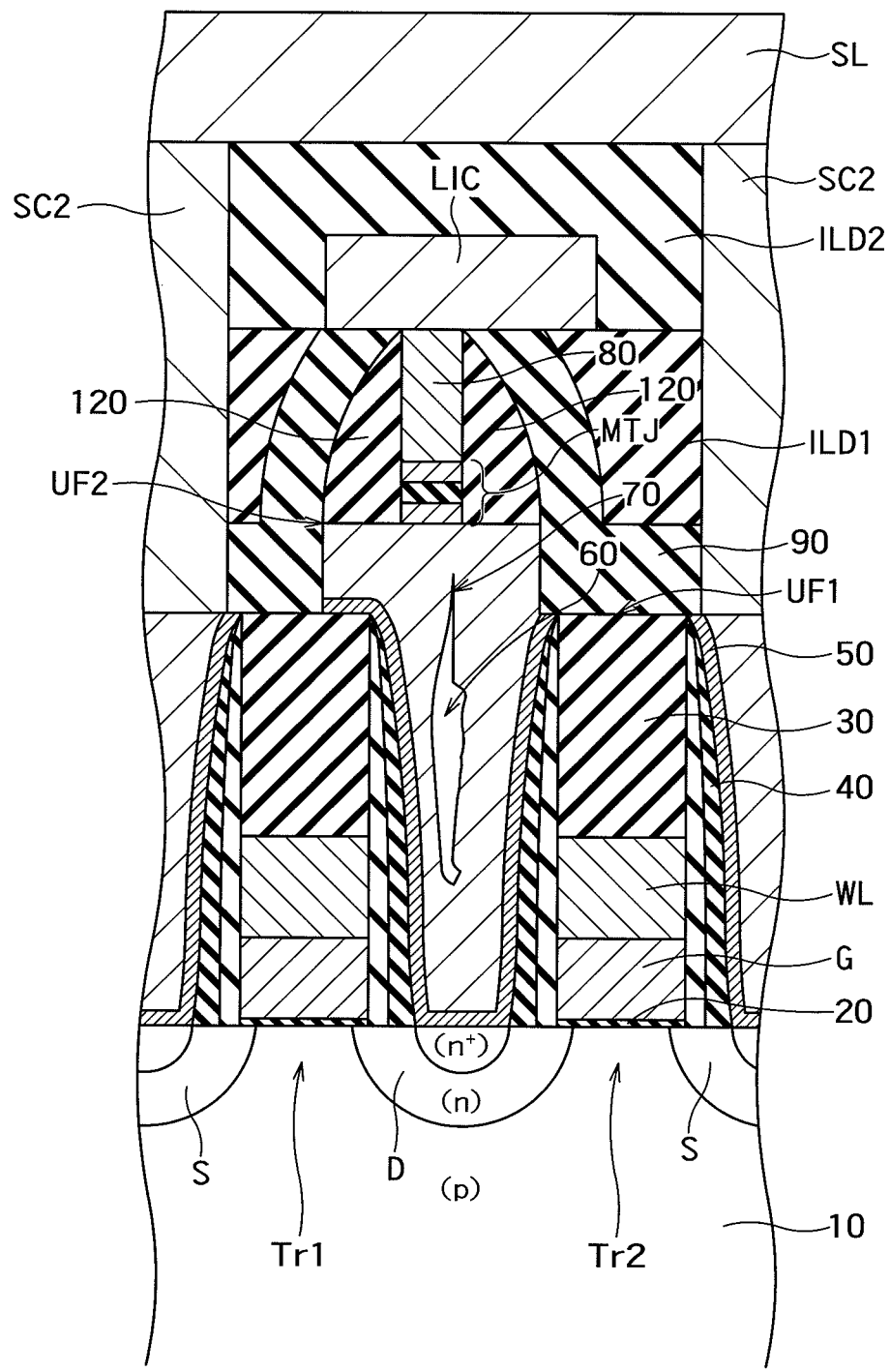

Thereafter, the protection film 90, the interlayer dielectric film ILD1, the local interconnect LIC, the interlayer dielectric film ILD2, the source contact SC2, and the source line SL are formed by a method identical to the manufacturing method according to the first embodiment. As a result, the MRAM according to the fourth embodiment is completed as shown in FIG. 20. The hardmask 81 is also called the electrode 80 like in the first embodiment.

According to the MRM in the fourth embodiment, an installation area of the MTJ element is smaller than an area of the upper surface UF2 of the drain contact DC. That is, power consumption is small because the size of the MTJ element is small.

On the other hand, an installation area of the MTJ element and the sidewall film 120 is equal to an area of the upper surface UF2 of the drain contact DC. That is, the MTJ element and the sidewall film 120 cover the entirety of the upper surface UF2 of the upper connector 200. Accordingly, the seam 70 and the void 60 are not exposed, and the MTJ element can be formed substantially horizontally on the surface of the silicon substrate 10. The MTJ element and the electrode 80 become stable and are not easily inclined because of the existence of the sidewall film 120.

Further, the upper surface UF2 of the drain contact DC is at a position higher than the upper surface UF1 of the switching transistors Tr1 and Tr2. Therefore, the fourth embodiment can be combined with the second embodiment. In the case of combining these embodiments, the fourth embodiment can also obtain effects of the second embodiment.

In the first to fourth embodiments, conductivity types of a substrate and a diffusion layer can be opposite. In this case, a switching transistor is changed from an N-type transistor to a P-type transistor, but a function of the switching transistor does not change. Therefore, effects of the first to fourth embodiments are not lost even when conductivity types of the substrate and the diffusion layer become opposite.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor memory device comprising:
   forming a plurality of switching transistors on a semiconductor substrate;
   embedding a conductive plug material between adjacent two of the switching transistors, and also depositing the material on an upper surface of the adjacent two switching transistor;
   depositing a first mask material on the plug material;
   processing the first mask material to leave the material on the plug material between the adjacent two switching transistors;
   forming a contact plug electrically connected to diffusion layers of the switching transistors by etching the plug material by using the first mask material as a mask;
   depositing an interlayer dielectric film in order to cover the contact plug after removing the first mask material;
   polishing the interlayer dielectric film until when an upper surface of the contact plug is exposed;
   depositing a material of a memory element storing data, on the contact plug;
   depositing a second mask material on the material of the memory element;
   processing the second mask material in order to have a plane area larger than a plane area of an upper surface of the contact plug; and
   forming the memory element having a bottom surface larger than an upper surface of the contact plug by etching a material of the memory element by using the second mask material as a mask.

2. A semiconductor memory device comprising:
   a semiconductor substrate;
   a plurality of switching transistors on the semiconductor substrate;
   a contact plug, formed from a single deposition layer, embedded between adjacent two of the switching transistors and insulated from gates of the adjacent two switching transistors, the contact plug being electrically connected to diffusion layers of the adjacent two switching transistors and having an upper surface at a position higher than an upper surface of the switching transistors;
   a memory element located immediately above the contact plug and directly contacted to an upper surface of the contact plug, a center of the memory element being located within the contact plug and being inconsistent with a center of the contact plug in a plane layout, the memory element storing data; and
a wiring on the memory element.

* * * * *